United States Patent
Chu et al.

(10) Patent No.: US 9,123,547 B2
(45) Date of Patent: Sep. 1, 2015

(54) STACKED SEMICONDUCTOR DEVICE AND METHOD OF FORMING THE SAME

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 13/916,197

(22) Filed: Jun. 12, 2013

(65) Prior Publication Data

US 2014/0264744 A1 Sep. 18, 2014

Related U.S. Application Data

(60) Provisional application No. 61/780,047, filed on Mar. 13, 2013.

(51) Int. Cl.
| | |
|---|---|
| H01L 41/04 | (2006.01) |
| H01L 41/047 | (2006.01) |
| H01L 41/113 | (2006.01) |
| H01L 27/06 | (2006.01) |
| B81C 1/00 | (2006.01) |
| H01G 5/16 | (2006.01) |

(52) U.S. Cl.
CPC ........ *H01L 27/0629* (2013.01); *B81C 1/00246* (2013.01); *H01G 5/16* (2013.01); *H01L 41/04* (2013.01); *H01L 41/0471* (2013.01); *H01L 41/0472* (2013.01); *H01L 41/1138* (2013.01); *B81B 2203/01* (2013.01); *B81B 2203/0127* (2013.01); *H01L 2924/1461* (2013.01)

(58) Field of Classification Search
CPC . H01L 41/04; H01L 41/0471; H01L 41/0472; H01L 41/1138; H01L 2924/1461; B81B 2203/01; B81B 2203/0127; B81C 1/00246; H01H 59/0009

See application file for complete search history.

(56) References Cited

U.S. PATENT DOCUMENTS

| | | | | |
|---|---|---|---|---|
| 8,587,038 | B2 * | 11/2013 | Kojima | 257/257 |
| 8,973,250 | B2 * | 3/2015 | Jahnes et al. | 29/594 |
| 2013/0001710 | A1 * | 1/2013 | Daneman et al. | 257/415 |

* cited by examiner

*Primary Examiner* — Phat X Cao
(74) *Attorney, Agent, or Firm* — Slater & Matsil, L.L.P.

(57) ABSTRACT

A stacked semiconductor device includes a first substrate. A multilayer interconnect is disposed over the first substrate. Metal sections are disposed over the multilayer interconnect. First bonding features are over the metal sections. A second substrate has a front surface. A cavity extends from the front surface into a depth D in the second substrate. The cavity has an interior surface. A stop layer is disposed over the interior surface of the cavity. A movable structure is disposed over the front surface of the second substrate and suspending over the cavity. The movable structure includes a dielectric membrane, metal units over the dielectric membrane and a cap dielectric layer over the metal units. Second bonding features are over the cap dielectric layer and bonded to the first bonding features. The second bonding features extend through the cap dielectric layer and electrically coupled to the metal units.

20 Claims, 22 Drawing Sheets

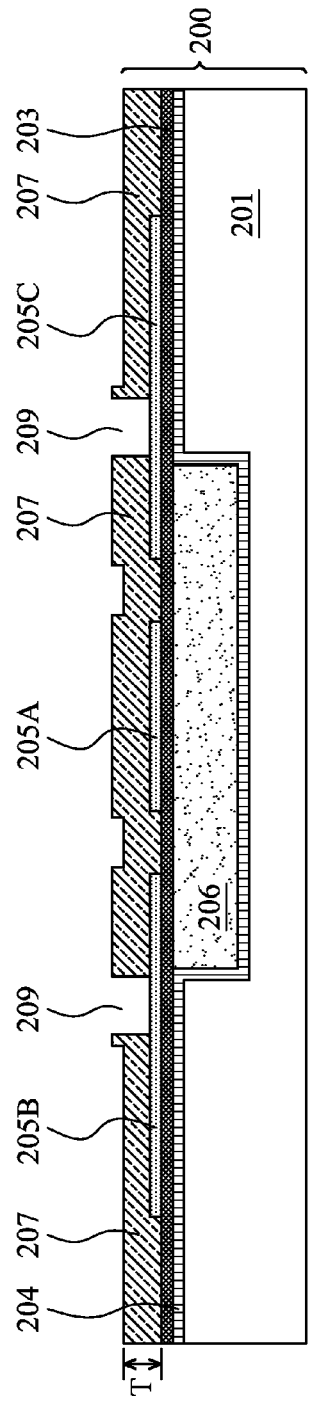
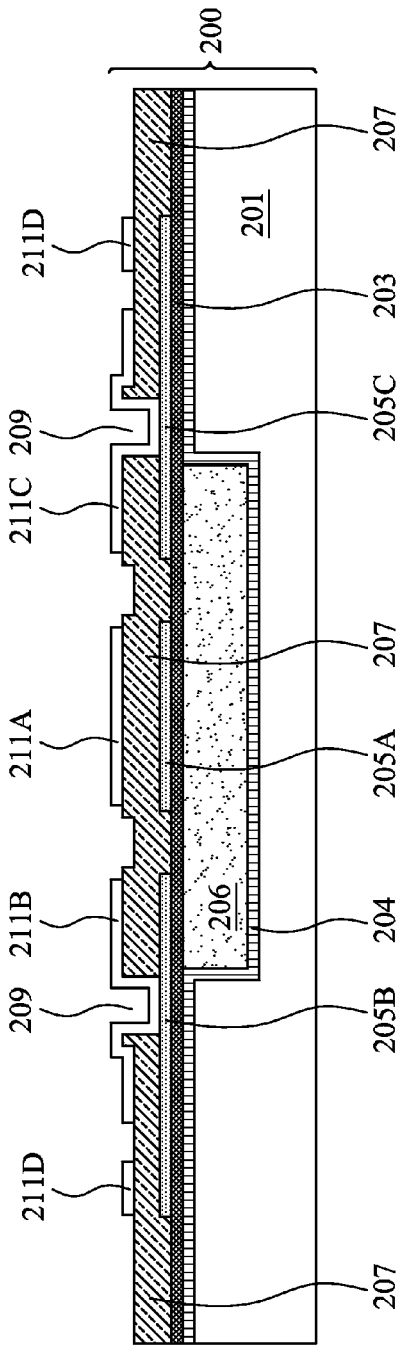
FIG. 2E
FIG. 2F

STACKED SEMICONDUCTOR DEVICE AND METHOD OF FORMING THE SAME

This application claims the benefit of U.S. Provisional Application No. 61/780,047, filed Mar. 13, 2013 entitled, "Stacked Semiconductor Device and Method of Forming the Same" which application is hereby incorporated herein by reference.

This application is related to commonly assigned U.S. patent application Ser. No. 13/916,148, filed on the same date herewith, and entitled "Stacked Semiconductor Device and Method of Forming the Same," which application is incorporated herein by reference.

TECHNICAL FIELD

This disclosure relates generally to a stacked semiconductor device and, more particularly, to a stacked semiconductor device including a micro-electro-mechanical system (MEMS) device and a complementary metal-oxide-semiconductor (CMOS) device and methods for forming the stacked semiconductor device.

BACKGROUND

A micro-electro-mechanical system (MEMS) device is a piece of technology with components on a very small scale. MEMS devices may have components within the micrometer size range and sometimes within the nanometer size range. A typical MEMS device may include processing circuitry as well as mechanical components for various types of sensors. MEMS applications include inertial sensors applications, such as motion sensors, accelerometers, and gyroscopes. Other MEMS applications include optical applications such as movable mirrors, RF applications such as RF switches and resonators, and biological sensing structures.

A demand for smaller ICs with higher performance has led to the development of stacked devices, where one of the stacked devices is dedicated to MEMS applications and other of the stacked devices is dedicated to logic or other types of CMOS circuitry. However, it can be difficult to manufacture a stacked semiconductor device with multiple types of function, due to integration problems of the different circuit fabrication technologies. Various techniques directed at configurations and fabrication methods of these stacked semiconductor devices including a MEMS device and a CMOS device have been implemented to try and further improve these integrated semiconductor devices' performances.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2K are cross-sectional views of a MEMS device in a stacked semiconductor device at various stages of manufacture according to one or more embodiments of this disclosure.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure. Further still, references to relative terms such as "top," "front," "bottom," and "back" are used to provide a relative relationship between elements and are not intended to imply any absolute direction. Various features may be arbitrarily drawn in different scales for simplicity and clarity.

According to one or more embodiments of this disclosure, a stacked semiconductor device including a micro-electro-mechanical system (MEMS) device bonded to a complementary metal-oxide-semiconductor (CMOS) device. The MEMS device includes a motion sensor (for example, a gyroscope or an accelerometer), a RF MEMS device (for example, a RF switch, resonator, or filter), a MEMS magnetometer, an optical MEMS device (for example, a MEMS micro-mirror), a MEMS oscillator, a MEMs microphone, and/or any other MEMS type device. The CMOS device includes a logic device, memory device (for example, a static random access memory (SRAM), radio frequency (RF) device, input/output (I/O) device, system-on-chip (SoC), other suitable type of device, or combinations thereof.

Figure 1A:
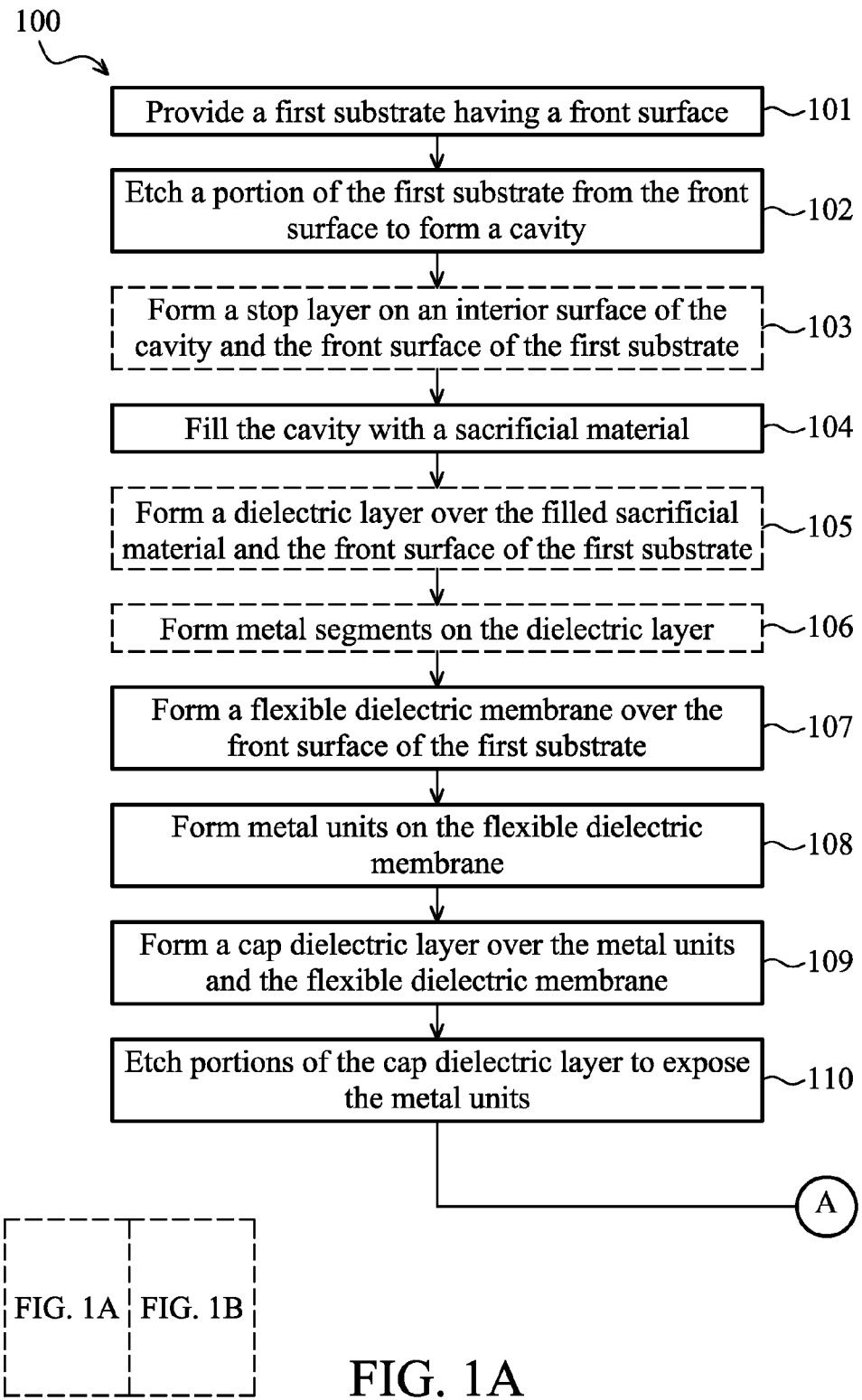
FIGS. 1A and 1B are a flowchart of a method of forming a stacked semiconductor device including a MEMS device and a CMOS device according to at least one embodiment of this disclosure.
Figure 1B:
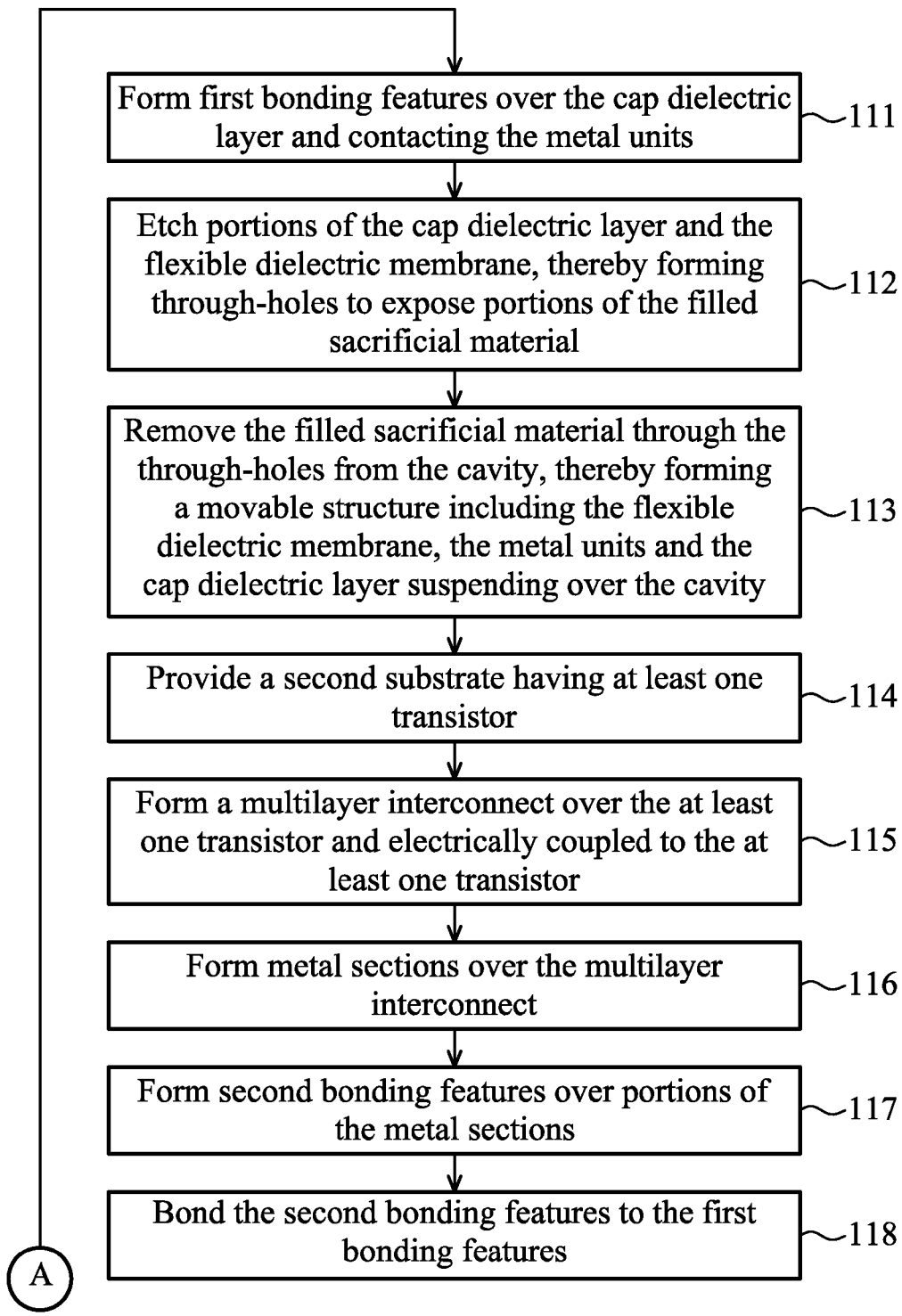

FIGS. 1A and 1B are a flowchart of a method 100 of forming a stacked semiconductor device including a MEMS device and a CMOS device according to at least one embodiment of this disclosure. FIGS. 2A-2K, 3A-3E, 4A-4B and 5A-5E are cross-sectional views of a stacked semiconductor device 400 (or 500) including a MEMS device 200 and a CMOS device 300 at various stages of manufacture according to various embodiments of the method 100 of FIGS. 1A and 1B. Additional processes may be provided before, during, or after the method 100 of FIGS. 1A and 1B. Various figures have been simplified for a better understanding of the inventive concepts of the present disclosure.

Referring now to FIGS. 1A and 1B, the operations 101-113 in the method 100 are for the MEMS device in the stacked semiconductor device. The operations 114-117 in the method 100 are for the CMOS device in the stacked semiconductor device. The operation 118 in the method 100 is for the MEMS device bonded to the CMOS device to form the stacked semiconductor device. The flowchart of the method 100 begins with operation 101. At operation 101, a first substrate having a front surface is provided. Next, the method 100 continues with operation 102 in which a portion of the first substrate is etched from the front surface to from a cavity in the first substrate.

Figure 2A:
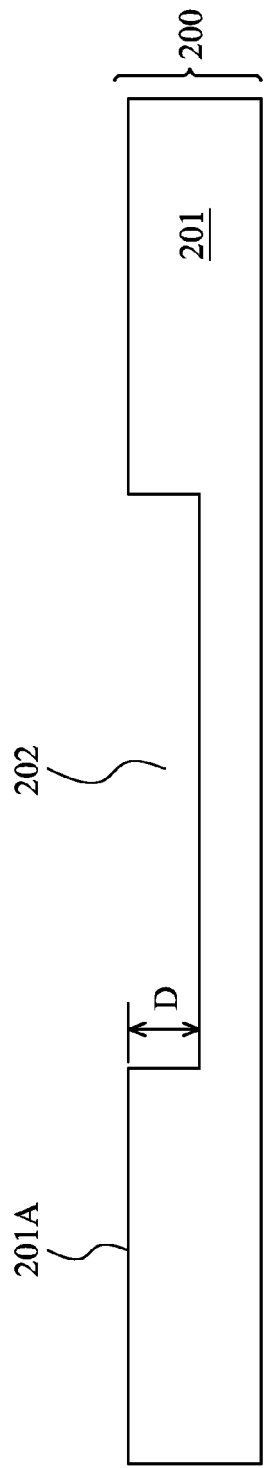

FIGS. 2A to 2K are cross-sectional views of a MEMS device 200 in a stacked semiconductor device at various stages of manufacture according to one or more embodiments of this disclosure. Referring to FIG. 2A, which is an enlarged cross-sectional view of a portion of a substrate 201 (also referred to as MEMS substrate 201) of the MEMS device 200 after performing operations 101 and 103. In some embodiments, the substrate 201 includes a plurality of MEMS chips marked on the substrate 201, which is in a wafer form. The plurality of MEMS chips are divided by scribe lines between the MEMS chips on the wafer. According to one or more embodiments of this disclosure, at least one MEMS device 200 is formed within a chip region of the MEMS substrate 201. The MEMS substrate 201 will go through a variety of cleaning, depositing, patterning, etching, releasing and doping steps to form the at least one MEMS device as mentioned in the previous text. The term "substrate" herein generally refers to a bulk substrate on which various layers and MEMS structures are formed. In some embodiments, the bulk substrate includes silicon substrate, silicon-on-insulator (SOI) substrate or germanium substrate. Examples of such layers include dielectric layers, doped layers, polysilicon layers or conductive layers. In the embodiments in FIGS. 2A-2K, the MEMS device 200 is referred to a RF MEMS switch device. The RF MEMS switch device includes a flexible top electrode of a micro-machined capacitor. With the up- and down-state of the flexible top electrode of the capacitor, the capacitance of the RF MEMS switch device is variable as a switch to control the transmission of a RF signal.

Referring to FIG. 2A, the MEMS substrate 201 is referred to a silicon substrate. The MEMS substrate 201 has front surface 201A. A cavity 202 is formed in the MEMS substrate 201. In some examples, a dry etching process in an ambience including fluorine is performed to etch a portion of the MEMS substrate 201 to form the cavity 202. The cavity 202 has a depth D extending from the front surface 201A into the MEMS substrate 201. The depth D is larger than 1 micrometer to ensure the motion of the later formed flexible top electrode. The cavity 202 has an interior surface including a bottom surface and a sidewall surface.

Referring back to FIGS. 1A and 1B, the method 100 continues with operation 103 in which a stop layer is optionally formed on an interior surface of the cavity and the front surface of the first substrate.

Figure 2B:
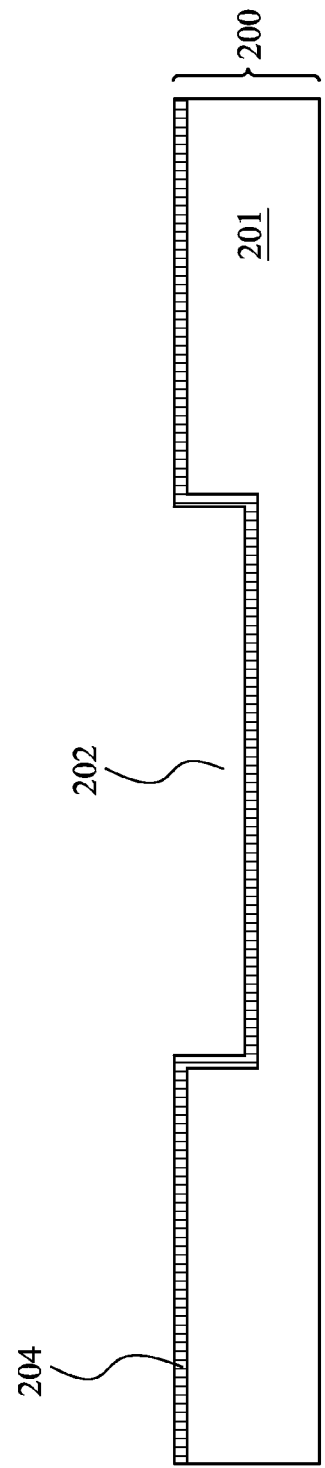

FIG. 2B is a cross-sectional view of the MEMS device 200 after performing operation 103. A stop layer 204 is optionally formed on the interior surface of the cavity 202 and the front surface 201A of the MEMS substrate 201. The stop layer 204 may include silicon oxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The stop layer 204 has higher etching or polishing resistance compared to the following formed sacrificial material. In one example, the stop layer 204 may be a conformal liner along interior surface of the cavity 202 and the front surface 201A of the MEMS substrate 201. The stop layer 204 has a thickness less than the depth D of the cavity 202. The formation method of the stop layer 204 includes chemical vapor deposition (CVD), low pressure CVD (LPCVD), atmospheric pressure CVD (APCVD), plasma enhanced CVD (PECVD), thermal oxidation or combinations thereof.

Referring back to FIGS. 1A and 1B, the method 100 continues with operation 104 in which the cavity is filled with a sacrificial material.

Figure 2C:
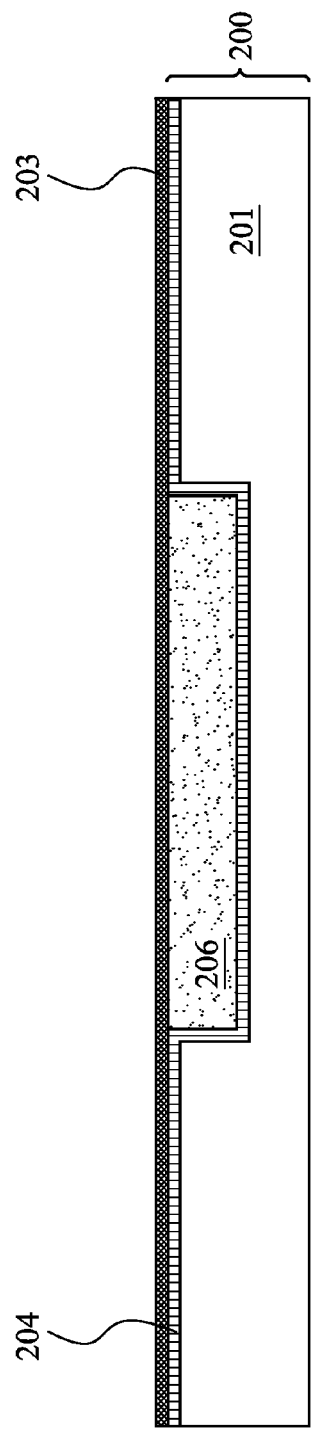

FIG. 2C is a cross-sectional view of the MEMS device 200 after performing operation 104. A sacrificial material 206 overfills the cavity 202 to a level above a top surface of the stop layer 204 on the front surface 201A of the MEMS substrate 201. In at least one example, the sacrificial material 206 includes polycrystalline silicon, amorphous silicon or other suitable materials which have less etching or polishing resistance compared to the stop layer 204 formed in operation 103. The sacrificial material 206 may be formed by CVD, PECVD or low pressure chemical vapor deposition (LPCVD). A planarization operation, such as chemical mechanical polishing (CMP) process and/or etching process, is applied to the sacrificial material 206 to reduce the thickness of the sacrificial material 206 to expose a portion of the stop layer 204. The planarization operation could cease as the top surface of the stop layer 204 is exposed. In one example, a removed rate ratio of the sacrificial material 206 to the stop layer 204 is larger than about 20. In at least one embodiment, a top surface of the planarized sacrificial material 206 is substantially planar to the top surface of the stop layer 204 on the front surface 201A of the MEMS substrate 201. In some embodiments, the stop layer 204 on the front surface 201A is completely removed during the planarization operation. The top surface of the planarized sacrificial material 206 is substantially planar to the front surface 201A of the MEMS substrate 201. In certain embodiments, there is no stop layer 204 formed in operation 103 if the MEMS substrate 201 has a higher etching or polishing resistance compared to the sacrificial material 206 during the planarization operation.

Referring back to FIGS. 1A and 1B, the method 100 continues with operation 105 in which a dielectric layer is optionally formed over the filled sacrificial material and the front surface of the first substrate. Next, the method 100 continues with operation 106 in which metal segments are optionally formed on the dielectric layer.

Figure 2D:
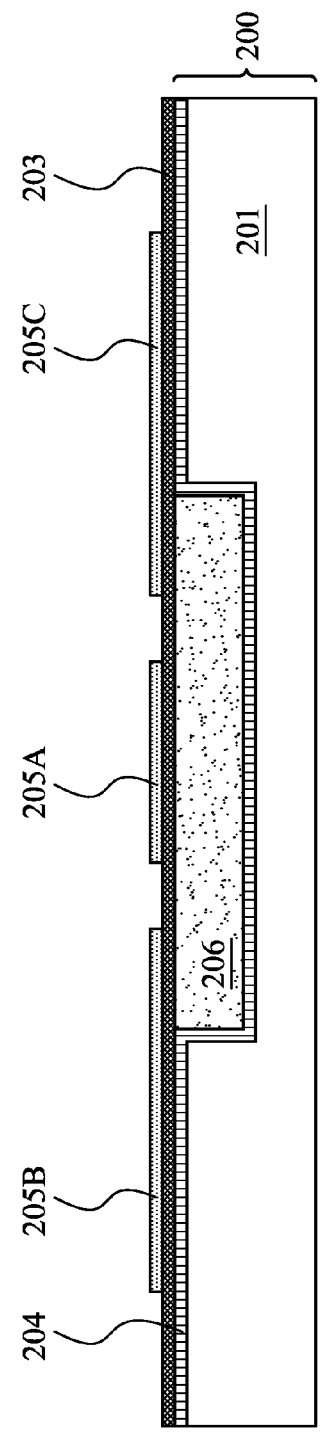

FIG. 2D is a cross-sectional view of the MEMS device 200 after performing operations 105 and 106. A dielectric layer 203 is formed on the filled sacrificial material 206 and the stop layer 204 on the front surface 201A of the MEMS substrate 201. The dielectric layer 203 has a higher etching resistance than the sacrificial material 206 in a following etching process to release the dielectric layer 203 from the top surface of the sacrificial material 206. The details will be described in later text. In some examples, the dielectric layer 203 includes silicon oxide, silicon nitride or silicon oxy-nitride. In certain examples, the dielectric layer 203 has a thickness in a range from about 500 angstrom to about 1200 angstrom. The formation method of the dielectric layer 203 includes chemical vapor deposition (CVD), low pressure CVD (LPCVD), atmospheric pressure CVD (APCVD), plasma enhanced CVD (PECVD), thermal oxidation or combinations thereof.

Still referring to FIG. 2D, a metal layer is formed using various deposition processes, lithography patterning processes, etching processes or combination thereof to form metal segments 205A to 205C on the dielectric layer 203. In some examples, the metal layer includes aluminum, copper, aluminum/copper alloy, titanium, tantalum, tungsten, metal silicide, gold, or combinations thereof. In certain examples, the metal segments 205A to 205C have a thickness in a range from about 3000 angstrom to about 7000 angstrom.

Referring back to FIGS. 1A and 1B, the method 100 continues with operation 107 in which a flexible dielectric membrane is formed over the front surface of the first substrate.

FIG. 2E is a cross-sectional view of the MEMS device 200 after performing operation 107. A dielectric layer 207 is formed over the metal segments 205A-205C and the dielectric layer 203. The dielectric layer 207 provides mechanical strength and rigidity to act as a flexible suspended membrane or beam for a movable structure in the MEMS device 200. The dielectric layer 207 is also referred to as dielectric membrane 207. In certain examples, the dielectric membrane 207 has a thickness T in a range from about 0.5 micrometer to about 5 micrometer. The dielectric membrane 207 may include silicon oxide, silicon nitride, silicon oxy-nitride or any suitable materials. The formation method of the dielectric membrane 207 includes chemical vapor deposition (CVD), low pressure CVD (LPCVD), atmospheric pressure CVD (APCVD), plasma enhanced CVD (PECVD), or combinations thereof.

After the formation of dielectric membrane 207, openings 209 are formed in the dielectric membrane 207 to expose a portion of the metal segments 205B and 205C. The openings 209 are formed using various lithography patterning processes, etching processes including dry etching or wet etching.

Referring back to FIGS. 1A and 1B, the method 100 continues with operation 108 in which metal units are formed on the flexible dielectric membrane over the front surface of the first substrate.

FIG. 2F is a cross-sectional view of the MEMS device 200 after performing operation 108. A metal layer is conformally formed on the dielectric membrane 207, along interior surface of the openings 209 and on the exposed portion of the metal segments 205B and 205C. The metal layer is patterned using various lithography patterning processes, etching processes or combination thereof to form metal units 211A to 211D over the dielectric membrane 207. In some examples, the metal units 211A to 211D include aluminum, copper, aluminum/copper alloy, titanium, tantalum, tungsten, metal silicide, gold, or combinations thereof. In certain examples, the metal units 211A to 211D have a thickness in a range from about 3000 angstrom to about 7000 angstrom.

The metal units 211A-211C are referred to as a top electrode in the MEMS device 200. The metal units 211B and 211C are on a portion of the dielectric membrane 207, along an interior surface of the openings 209 and on the exposed portion of the metal segments 205B and 205C, respectively. The metal units 211B and 211C configured to connect a power source from the MEMS device 200 are pull-down elements of the top electrode. The metal unit 211A is adjacent to the metal units 211B and 211C. The metal unit 211A, separated from the metal units 211B and 211C by gaps, is configured to transmit a signal of the MEMS device 200. The metal unit 211A is referred to as a signal element of the top electrode.

Referring back to FIGS. 1A and 1B, the method 100 continues with operation 109 in which a cap dielectric layer is formed over the metal units and the flexible dielectric membrane. Next, the method 100 continues with operation 110 in which portions of the cap dielectric layer are etched to expose the metal units.

Figure 2G:
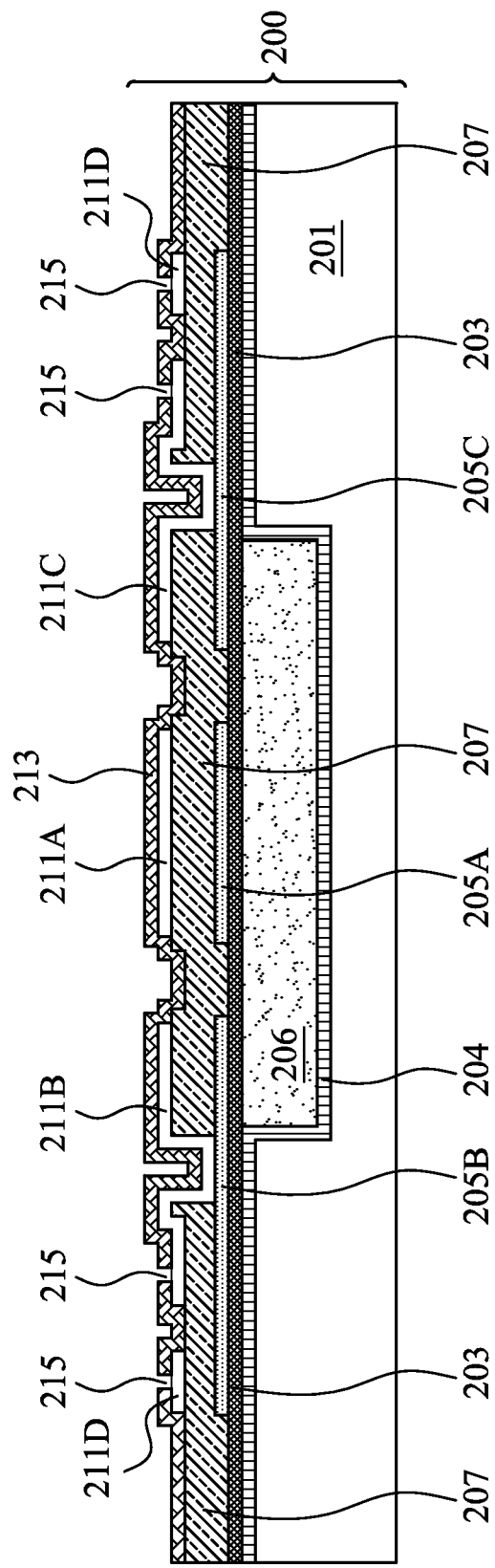

FIG. 2G is a cross-sectional view of the MEMS device 200 after performing operations 109 and 110. A cap dielectric layer 213 is conformally formed on the metal units 211A-211D, along the interior surface of the openings 209 and on the exposed portion of the dielectric membrane 207. The cap dielectric layer 213 may include silicon oxide, silicon nitride, silicon oxy-nitride or any suitable materials. In certain examples, the cap dielectric layer 213 has a thickness in a range from about 500 angstrom to about 1200 angstrom. The formation method of the cap dielectric layer 213 includes chemical vapor deposition (CVD), low pressure CVD (LPCVD), atmospheric pressure CVD (APCVD), plasma enhanced CVD (PECVD), or combinations thereof. The cap dielectric layer 213 may protect the underlying metal units 211A-211D or top electrode from damage in the following processes, such as bonding or sacrificial material 206 removing.

A plurality of vias 215 is formed in the cap dielectric layer 213 to expose a portion of the metal units 211B, 211C and 211D. The vias 215 are formed using various lithography patterning processes, etching processes including dry etching or wet etching.

Referring back to FIGS. 1A and 1B, the method 100 continues with operation 111 in which first bonding features are formed over the cap dielectric layer and contacting the metal units.

Figure 2H:
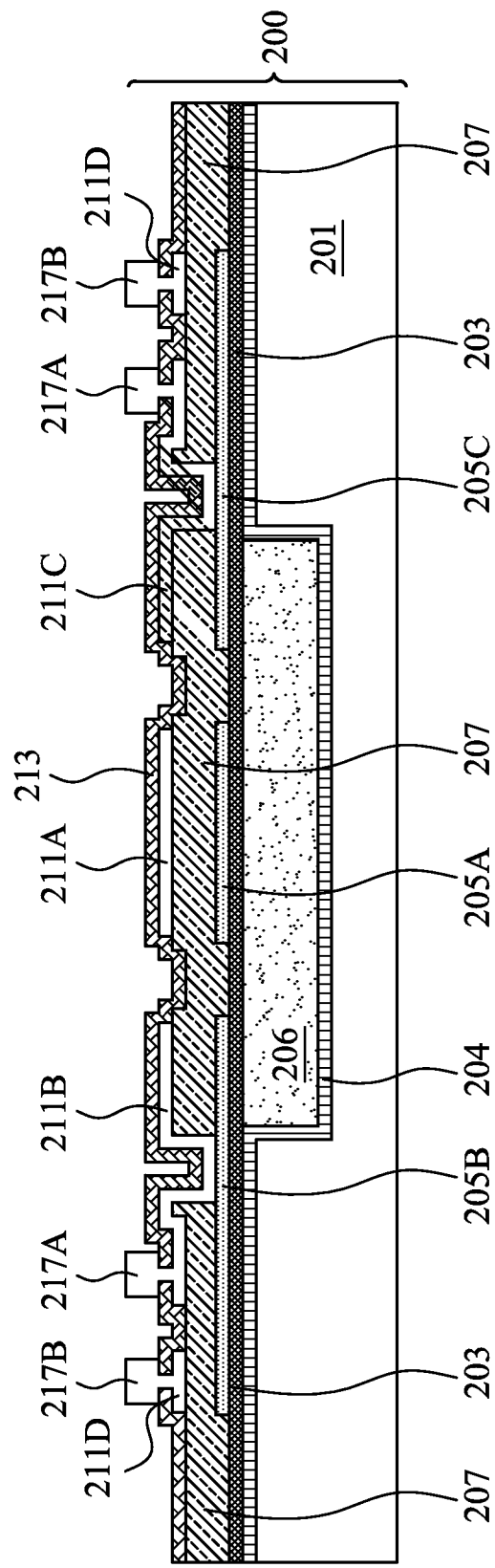

FIG. 2H is a cross-sectional view of the MEMS device 200 after performing operation 111. Bonding features 217A and 217B are formed on portions of the cap dielectric layer 213, in the plurality of vias 215 and contacting the metal units 211B, 211C and 211D, respectively. The bonding features (217A and 217B) include a conductive material, such as a metal material or a semiconductor material. The metal material of the bonding features includes aluminum, copper or aluminum/copper alloy. The semiconductor material of the bonding features includes silicon or germanium. The bonding features (217A and 217B) are formed by depositing the conductive material on the patterned cap dielectric layer 213 and overfilling the vias 215, and then patterning the conductive material depending on design requirements of the MEMS device 200. The deposition process includes chemical vapor deposition (CVD), physical vapor deposition (PVD), plasma enhanced CVD (PECVD), low-pressure CVD (LPCVD), atomic layer CVD (ALCVD), atmospheric pressure CVD (APCVD), other deposition methods, or combinations thereof. The conductive material is patterned using lithography patterning processes, etching processes, other suitable processes, or combinations thereof.

The bonding features 217A contact the metal units 211B and 211C, respectively, configured to provide an electrical path from an external power source to pull-down elements of the top electrode (metal units 211B and 211C) of the MEMS device 200. The bonding features 217B are at an edge of the MEMS device 200 and form a closed loop seal ring surrounding the bonding features 217A, signal element of the top electrode (metal unit 211A), and pull-down elements of the top electrode (metal units 211B and 211C). The bonding features 217B are formed over the metal unit 211D. With the existence of the metal unit 211D, bonding features 217B are substantially coplanar to the bonding features 217A which is over the metal unit 211B or 211C. Due to the coplanarity of the bonding features 217A and the bonding features 217B, the MEMS device 200 is capable to having a better bonding interface and bonding strength with a CMOS device in the following bonding process.

Referring back to FIGS. 1A and 1B, the method 100 continues with operation 112 in which portions of the cap dielectric layer and the flexible dielectric membrane are etched to expose portions of the filled sacrificial material. In some embodiments, portions of the dielectric layer over the filled sacrificial material are etched if the dielectric layer is formed in operation 105.

Figure 2I:
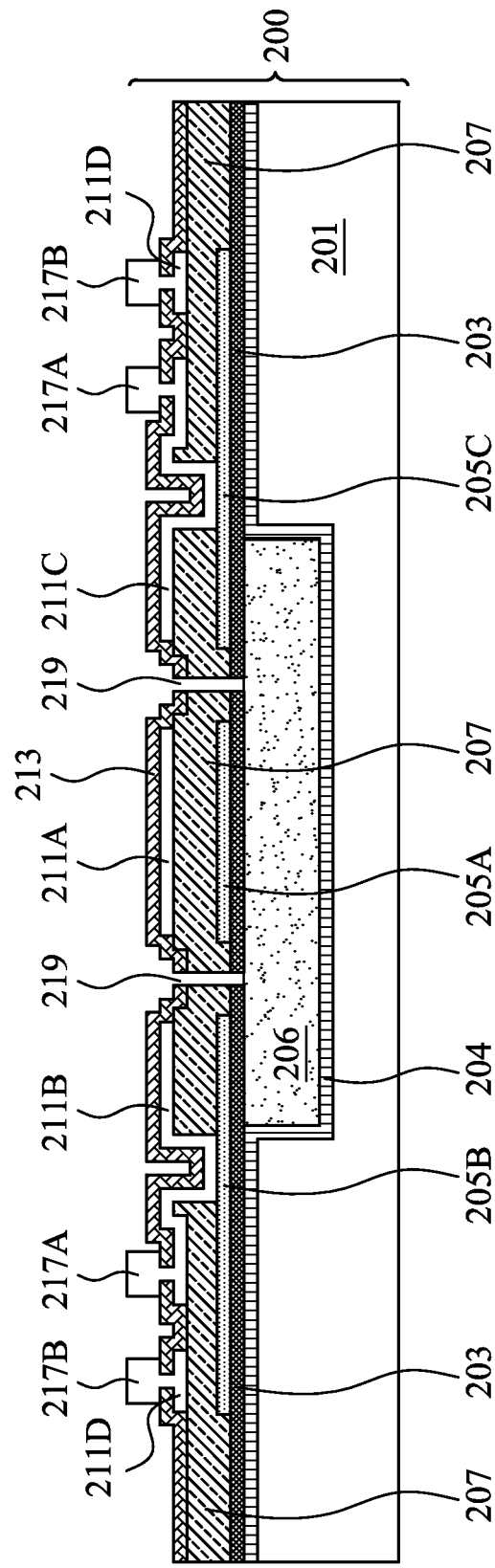

FIG. 2I is a cross-sectional view of the MEMS device 200 after performing operation 112. Through-holes 219 are formed in the MEMS device 200 shown in FIG. 2H. The through-holes 219 extend through the cap dielectric layer 213, the dielectric membrane 207, the dielectric layer 203 and exposes portions of the sacrificial material 206. The through-holes 219 are formed using various lithography patterning processes, etching processes including dry etching or wet etching. In some examples, the through-holes 219 are formed in a dry etching process in an ambience including fluorine.

Figure 2J:
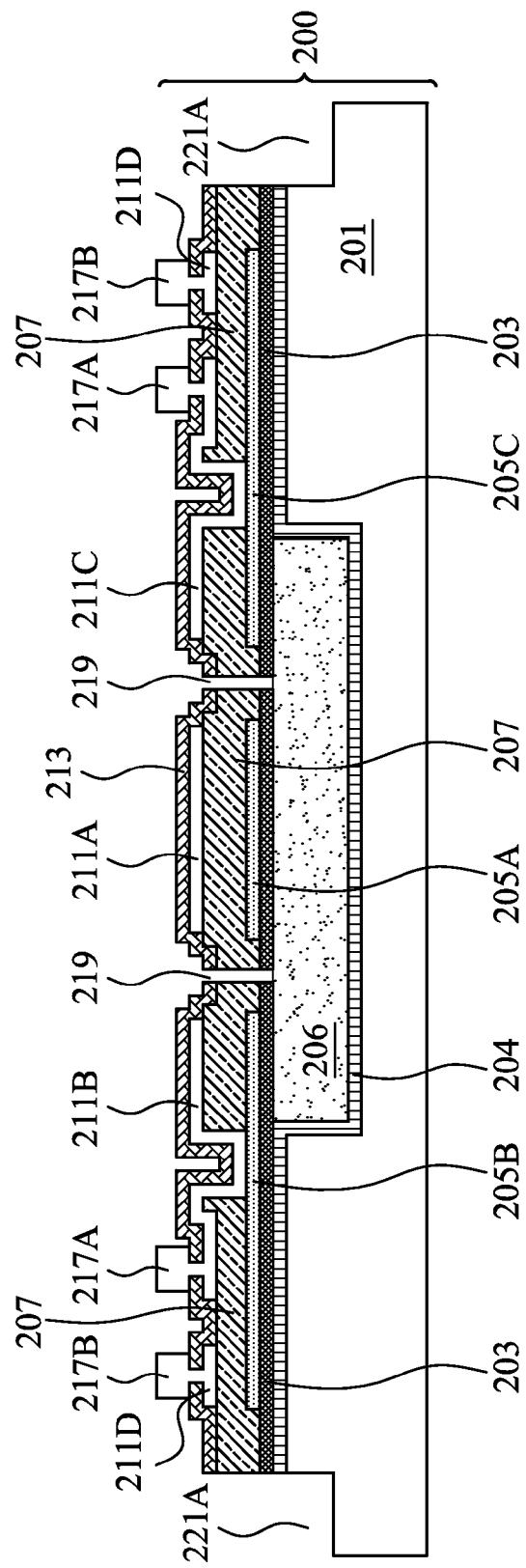

Referring to FIG. 2J, the MEMS device 200 may further include recesses 221A formed at the edge of the MEMS device 200. The recesses 221A are at outside of the bonding features 217B. The recesses 221A extend through the cap dielectric layer 213, the dielectric membrane 207, the dielectric layer 203 and portions of MEMS substrate 201. The recesses 221A are formed using various lithography patterning processes, etching processes including dry etching or wet etching.

Referring back to FIGS. 1A and 1B, the method 100 continues with operation 113 in which the filled sacrificial material is removed through the through-holes from the cavity, thereby forming a movable structure including the flexible dielectric membrane, the metal units and the cap dielectric layer suspending over the cavity.

Figure 2K:
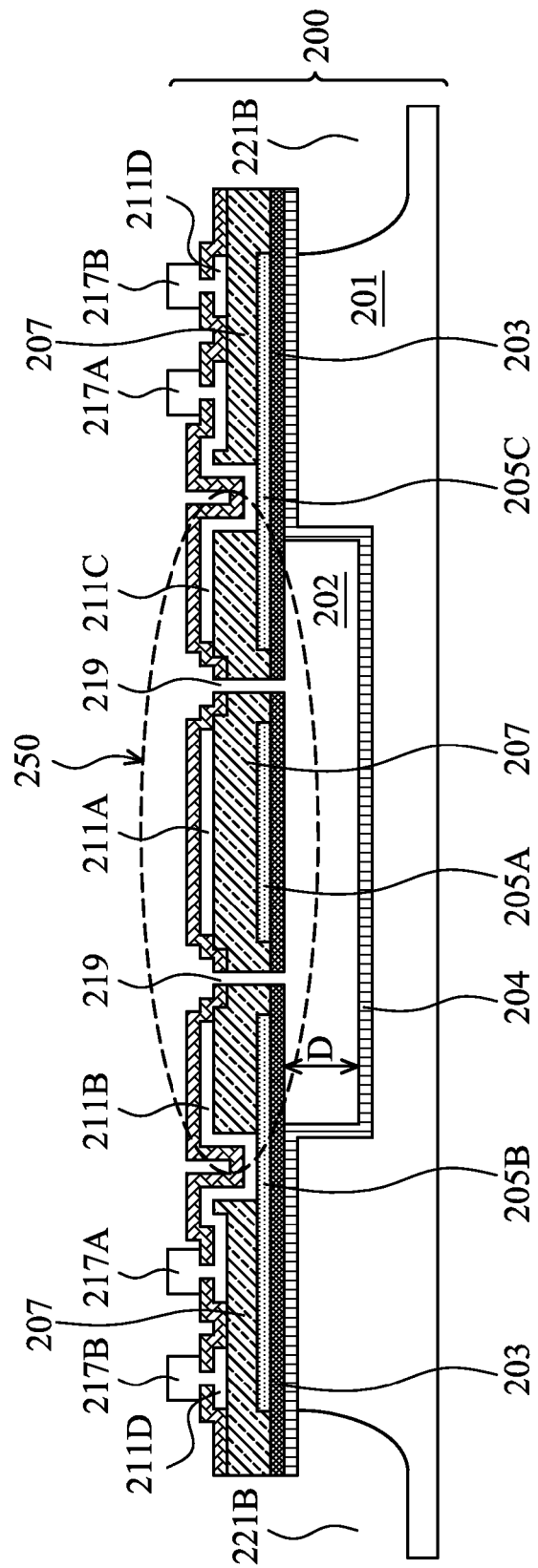

FIG. 2K is a cross-sectional view of the MEMS device 200 after performing operation 113. In some examples, a dry etching process in an ambience including fluorine is performed through the through-holes 219 and the recesses 221A to isotropic etch the filled sacrificial material 206 and portions of the MEMS substrate 201. The cavity 202 appears under the dielectric membrane 207 in the MEMS substrate 201 and recesses 221B are formed at the positions of recesses 221A shown in FIG. 2J. The dielectric layer 203, the dielectric membrane 207 and the cap dielectric layer 213 have a higher etching resistance than the sacrificial material 206 and the MEMS substrate 201 in the etching process to form the cavity 202 and the recesses 221B. An etching selectivity of the sacrificial material 206 (and the MEMS substrate 201) relative to the dielectric layer 203, the dielectric layer 207 or the cap dielectric layer 213 is larger than 20, as an example. Also, the stop layer 204 has a higher etching resistance than the sacrificial material 206 in the etching process to remove the sacrificial material 206 and protect the MEMS substrate 201 from damage.

After the formation of the cavity 202, a movable structure 250 is released from the MEMS substrate 201 (or the sacrificial material 206) and suspends over the cavity 202. The movable structure 250 includes the dielectric membrane 207 sandwiched by a movable top electrode (metal units 211A-211C) and the metal segments (205A-205C). The movable structure 250 further includes the cap dielectric layer 213 and the dielectric layer 203 on top and bottoms surfaces of the movable structure 250, respectively. The cavity 223 has the depth D from a bottom surface of the dielectric layer 203 to the bottom surface of the cavity 202. The depth D is larger than 1 micrometer to ensure the motion of the movable structure 250.

In embodiments in FIGS. 2A-2K, the movable structure 250 is a symmetrical structure with a metal layer (for example, the metal units 211A-211C or the metal segments 205A-205C) and a dielectric layer (for example, the cap dielectric layer 213 or the dielectric layer 203) disposed on each side of the dielectric membrane 207. The metal segments 205A-205C and the dielectric layer 203, which are over the bottom surface of the dielectric membrane 207, may balance the stress from the metal units 211A-211C and the cap dielectric layer 213, which are over the top surface of the dielectric membrane 207. Due to the stress balance in each side, the movable structure 250 may not bend upward or downward. In certain embodiments, the movable structure 250 is an asymmetrical structure with a metal layer (for example, the metal units 211A-211C) and a dielectric layer (for example, the cap dielectric layer 213) disposed only over the top surface of the dielectric membrane 207.

The dielectric layer 207 provides mechanical strength and rigidity to act as a suspended membrane or beam for the movable structure 250 in the MEMS device 200. In some examples, a ratio of the thickness of the dielectric membrane 207 to the thickness of the metal units 211A-211C or the metal segments 205A-205C is in a range from about 2 to about 7. In certain examples, a ratio of the thickness of the dielectric membrane 207 to the thickness of the dielectric layer 203 or the cap dielectric layer 213 is in a range from about 5 to about 70.

FIGS. 3A to 3E are cross-sectional views of a CMOS device 300 in a stacked semiconductor device at various stages of manufacture according to various embodiments to form a stacked semiconductor device. Additional processes may be provided before, during, or after the manufacture stages in FIGS. 3A to 3E. Various figures have been simplified for a better understanding of the inventive concepts of the present disclosure.

Similar to the MEMS device 200, at least one the CMOS device 300 is formed within a chip region of a CMOS substrate. A plurality of CMOS chips are divided by scribe lines between the COMS chips in the CMOS substrate in a wafer form. The CMOS substrate will go through a variety of cleaning, depositing, patterning, etching, and doping steps to form the at least one CMOS device within a chip region. The CMOS device includes a logic device, memory device (for example, a static random access memory (SRAM), radio frequency (RF) device, input/output (I/O) device, system-on-chip (SoC), other suitable type of device, or combinations thereof. Various device structures may be formed in the CMOS device including transistors, resistors, and/or capacitors, which may be connected through an interconnect layer to additional integrated circuits.

Referring back to FIGS. 1A and 1B, the operations 114-117 in the method 100 are for the CMOS device in the stacked semiconductor device. The method 100 continues with operation 114 in which a second substrate having at least one transistor is provided. The method 100 continues with operation 115 in which a multilayer interconnect is formed over the at least one transistor and electrically coupled to the at least one transistor. The method 100 continues with operation 116 in which metal sections are formed over the multilayer interconnect.

Figure 3A:
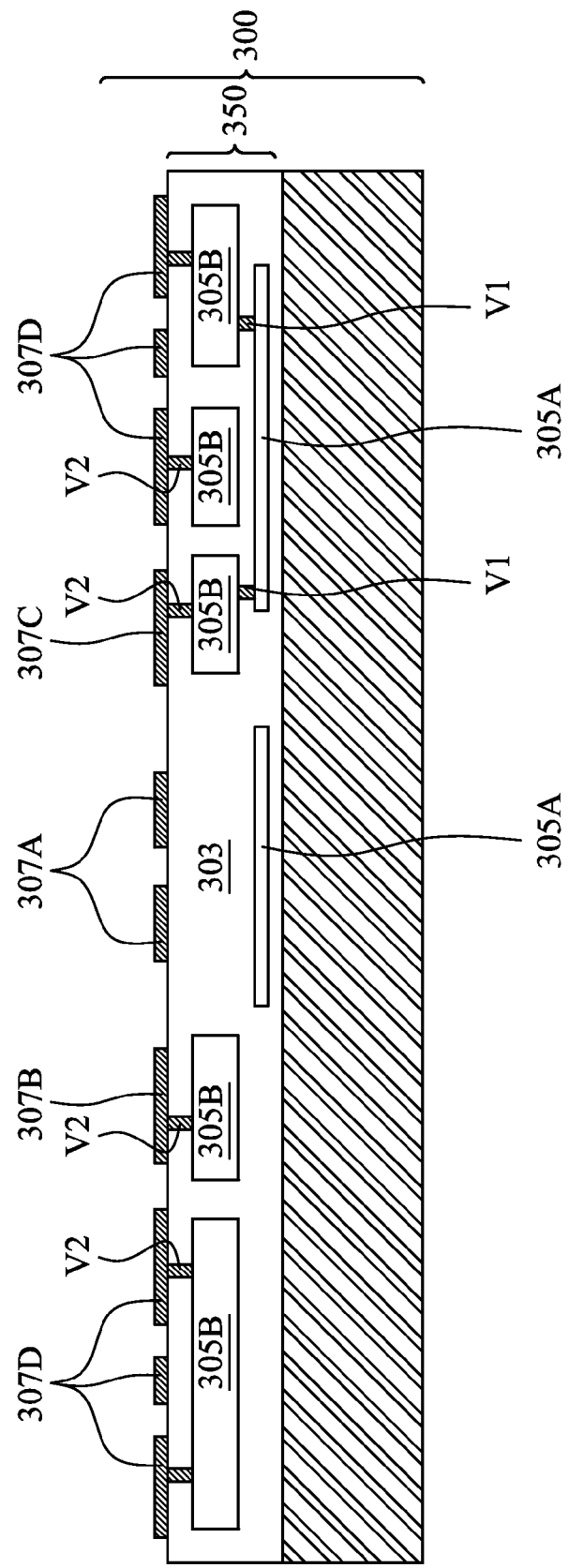
FIGS. 3A to 3E are cross-sectional views of a CMOS device in a stacked semiconductor device at various stages of manufacture according to one or more embodiments of this disclosure.

FIG. 3A is a cross-sectional view of the CMOS device 300 after performing operations 114-116. Referring to FIG. 3A, which is an enlarged cross-sectional view of a portion of a CMOS device 300. The CMOS device 300 includes a substrate 301 (also referred to as CMOS substrate 301). In the depicted embodiment, the CMOS substrate 301 is a semiconductor substrate including silicon. Alternatively or additionally, the CMOS substrate 301 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 301 may be a semiconductor on insulator (SOI). The CMOS device 300 may further include various device structures (not shown) over the CMOS substrate 301. Various device structures may include transistors, resistors, and/or capacitors.

A multilayer interconnect (MLI) 350 is formed over a front surface of the CMOS substrate 301. The MLI 350 is coupled to various device structures or components of the CMOS device 300. The MLI 350 includes various conductive features, which may be vertical interconnects in different levels, such vias V1 and V2, and horizontal interconnects in different levels, such as lines 305A and 305B. The various conductive features in MLI 350 include aluminum, copper, aluminum/silicon/copper alloy, titanium, titanium nitride, tungsten, polysilicon, metal silicide, or combinations thereof. The conductive features in MLI 350 are formed by suitable process, including deposition, lithography patterning, and etching processes to form vertical and horizontal interconnects.

The various conductive features of the MLI 350 are disposed within an interlayer dielectric (ILD) layer 303. In some examples, The ILD layer 303 may have a multilayer structure. The ILD layer 303 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The formation process for ILD layer 303 includes chemical vapor deposition (CVD), PECVD, LPCVD, APCVD, other deposition methods, or combinations thereof.

Still referring to FIG. 3A, the CMOS device 300 further includes a plurality of metal sections (307A-307D) formed on the ILD layer 303 and coupled to the MLI 350. The metal sections (307A-307D) are formed by suitable process, including deposition, lithography patterning, and etching processes. The metal sections (307A-307D) include conductive materials, such as aluminum, aluminum/silicon/copper alloy, titanium, titanium nitride, tungsten, gold, metal silicide, or combinations thereof.

In the depicted embodiment, the metal sections 307A-307C are referred to as a bottom electrode in the CMOS device 300. Corresponding to the pull-down elements of the top electrode (the metal units 211B and 221C) in the MEMS device 200, the metal sections 307B and 307C are pull-down elements of the bottom electrode which are configured to connect a power source from the CMOS device 300. Corresponding to the signal element of the top electrode (the metal unit 211A) in the MEMS device 200, the metal sections 307A in the CMOS device 300 are referred to as a signal element of the bottom electrode which are configured to transmit a signal cooperating with the top electrode (the metal unit 211A) of the MEMS device 200. The metal sections 307A are adjacent to the metal sections 307B and 307C. The metal sections 307A separated from the metal sections 307B and 307C by gaps. The metal sections 307D are configured to connect bonding features formed over the metal sections 307D in the following processes.

Figure 3B:
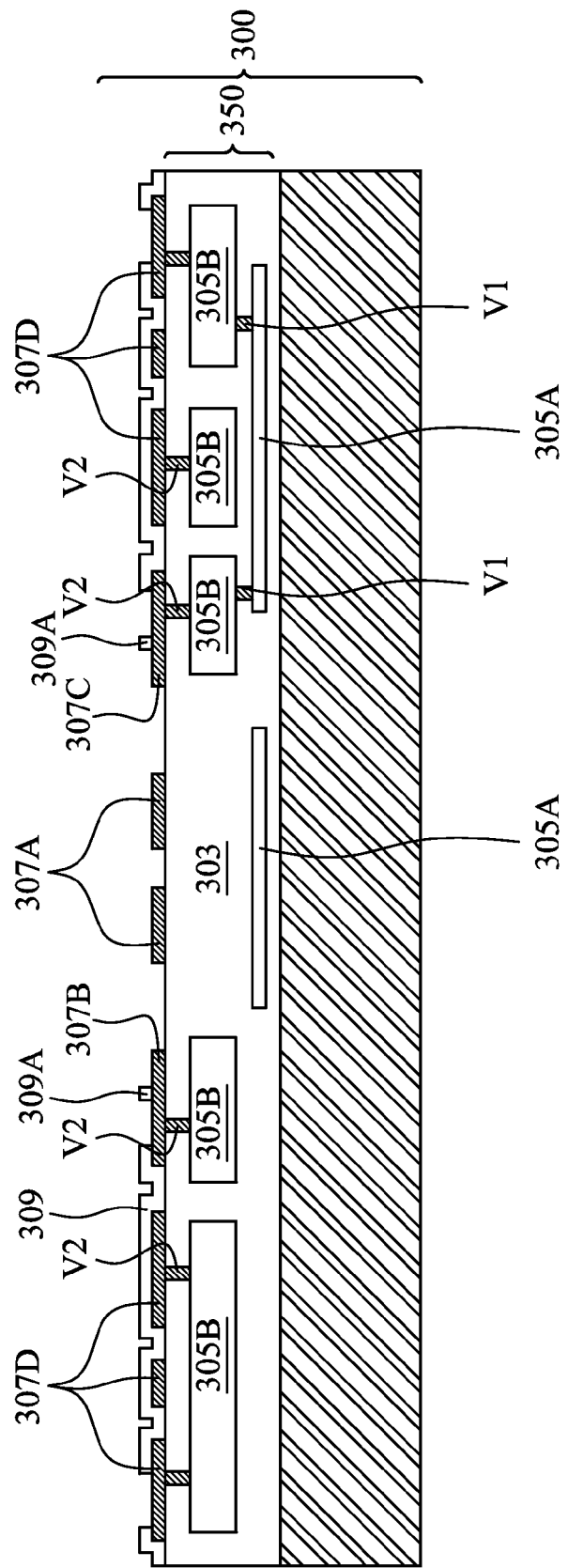

Referring to FIG. 3B, the CMOS device 300 further includes a dielectric layer 309 formed on the metal sections (307A-307D) and the exposed ILD layer 303 of the CMOS device 300. The dielectric layer 309 includes silicon dioxide, silicon nitride, silicon oxynitride, TEOS oxide, PSG, BPSG, FSG, carbon doped silicon oxide, low-k dielectric material, or combinations thereof. Portions of the dielectric layer 309 are removed to form dielectric bumps 309A on the metal sections 307B and 307C (pull-down elements of the bottom electrode). Remaining portions of the dielectric layer 309 cover the metal sections 307D and expose a portion of the metal sections 307D.

Figure 3C:
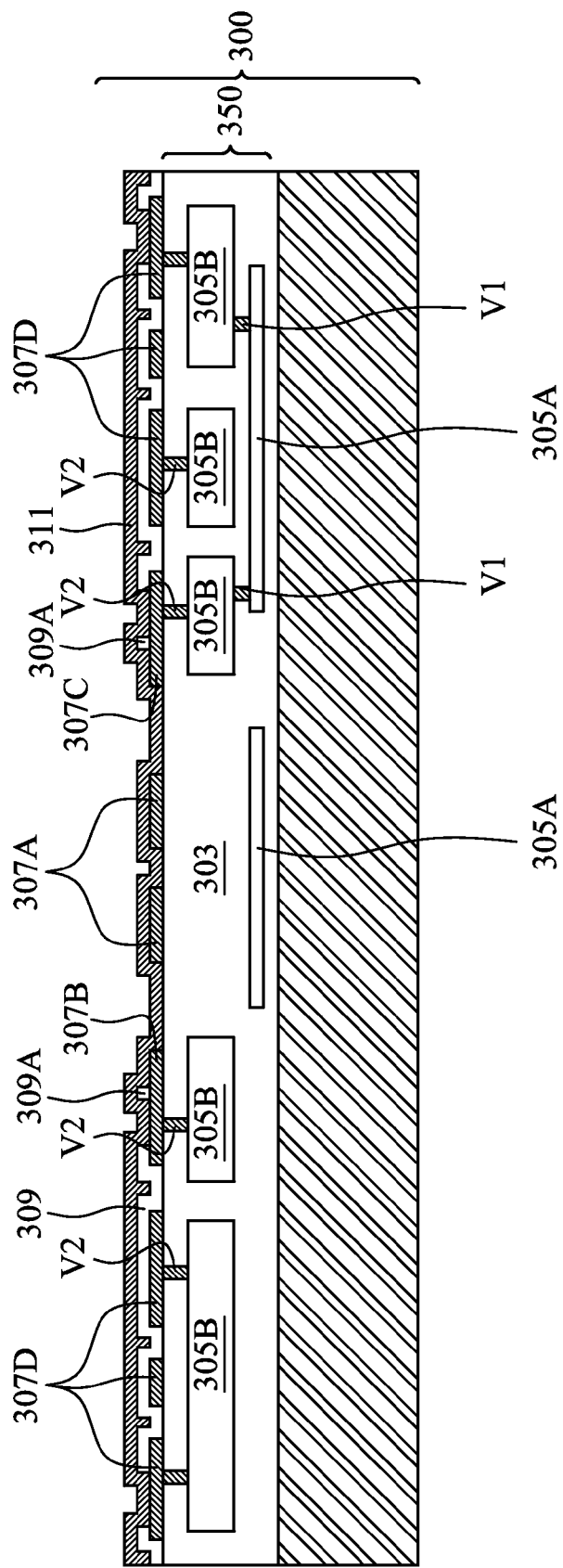

Referring to FIG. 3C, a protection dielectric layer 311 is formed on the CMOS device 300 shown in FIG. 3B. The protection dielectric layer 311 includes silicon dioxide, silicon nitride, silicon oxynitride, TEOS oxide, PSG, BPSG, FSG, carbon doped silicon oxide, low-k dielectric material, or combinations thereof. The protection dielectric layer 311 may protect the underlying metal sections (307A-307D) or bottom electrode from damage in the following processes, such as bonding. Since there is no dielectric bump 309A on the metal sections 307A, combined bumps composed of the dielectric bumps 309A and the protection dielectric layer 311 on the metal sections 307B and 307C have a height higher than a height of the protection dielectric layer 311 on the metal sections 307 alone. The combined bumps may withstand the pull-down elements of top electrode (metal units 211B and 211C) of the MEMS device 200 to touch the pull-down elements of bottom electrode (the metal sections 307B and 307C) of the CMOS device 300 during a moving operation of the stacked device. The combined bumps may also provide a counterforce on the top electrode in the MEMS device 200 to prevent sticking on the bottom electrode in the CMOS device 300 if there is a residual electrostatic force between the top and bottom electrodes.

Figure 3D:
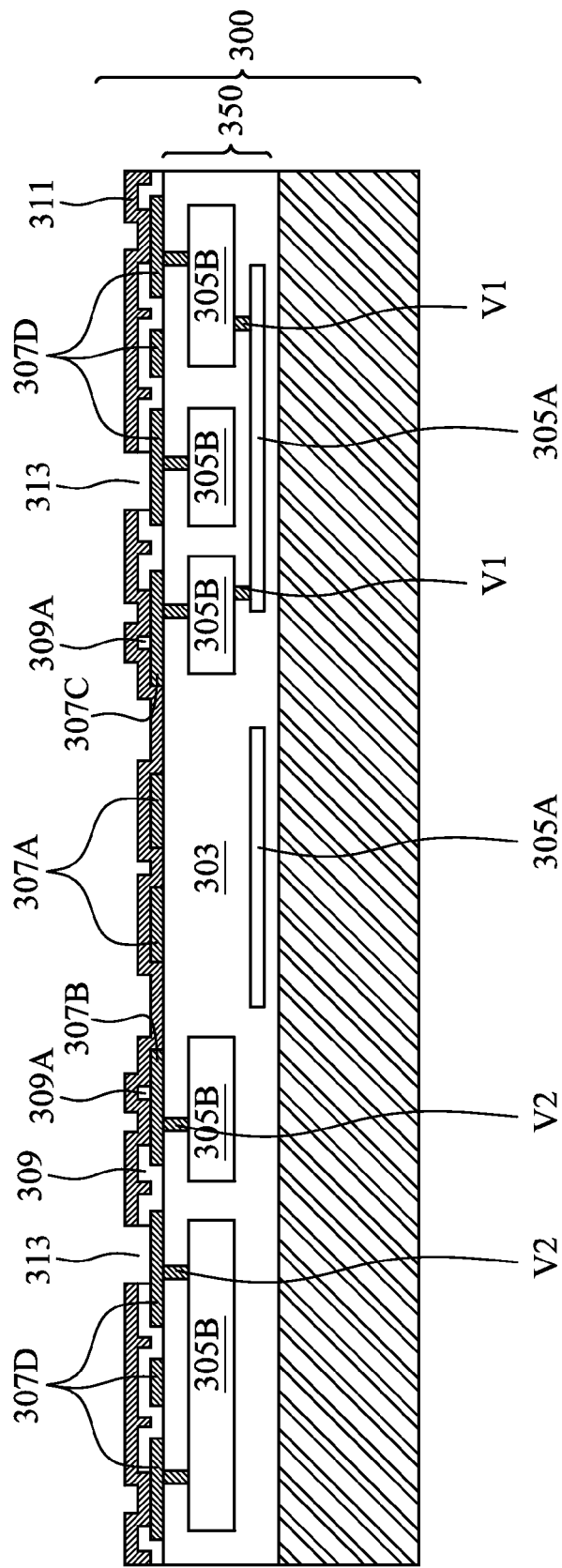

Referring to FIG. 3D, apertures 313 are formed extending through the protection dielectric layer 311 and the dielectric layer 309 to expose portions of the metal sections 307D. The apertures 313 are formed by suitable process, including lithography patterning and etching processes.

Referring back to FIGS. 1A and 1B, the method 100 continues with operation 117 in which second bonding features are formed over portions of the metal sections.

Figure 3E:
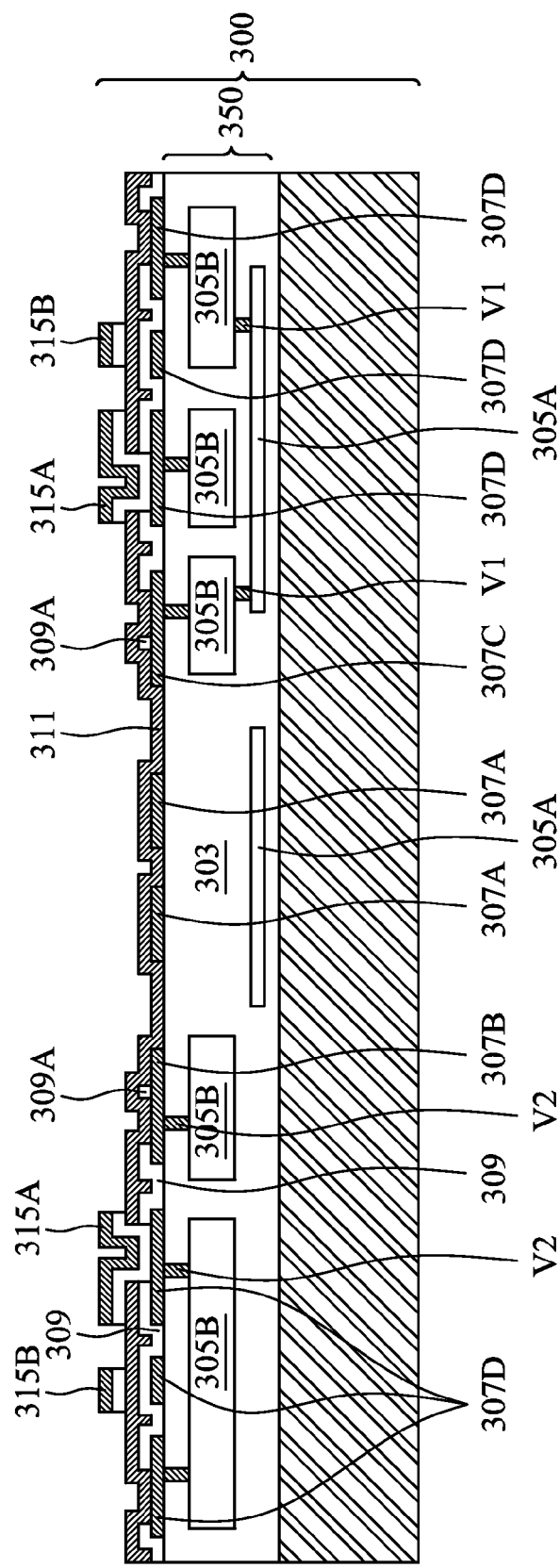

FIG. 3E is a cross-sectional view of the CMOS device 300 after performing operation 117. Referring to FIG. 3E, bonding features 315A-B are formed over the CMOS device 300 shown in FIG. 3D. The bonding features 315A are formed on portions of the protection dielectric layer 311, in apertures 313 and contacting the metal sections 307D. After the MEMS device 200 bonded to the CMOS device 300 to form the stacked semiconductor device, the bonding features 315A are configured to provide an electrical path from an external power source to pull-down elements of the top electrode of the MEMS device 200 through the MLI 350 and the bonding features 217A. The bonding features 315B are formed on portions of the protection dielectric layer 311 at an edge of the CMOS device 300. The bonding features 315B form a closed loop seal ring surrounding the bonding features 315A, the signal element of the bottom electrode (metal sections 307A), and pull-down elements of the bottom electrode (metal sections 307B and 307C). The bonding features 315B are formed over the metal sections 307D. In some examples, bonding features 315A are substantially coplanar to the bonding features 315B.

The bonding features (315A and 315B) include a conductive material, such as a metal material or a semiconductor material. The metal material of the bonding features includes aluminum, copper or aluminum/copper alloy. The semiconductor material of the bonding features includes silicon or germanium. The bonding features (315A and 315B) are formed by depositing a conductive layer on the patterned protection dielectric layer 311 and overfilling the apertures 313, and then patterning the conductive layer depending on design requirements of the MEMS device 200. The deposition process of the conductive layer includes chemical vapor deposition (CVD), physical vapor deposition (PVD), or other deposition methods. The conductive layer is patterned using lithography patterning processes, etching processes, other suitable processes, or combinations thereof.

Figure 4A:
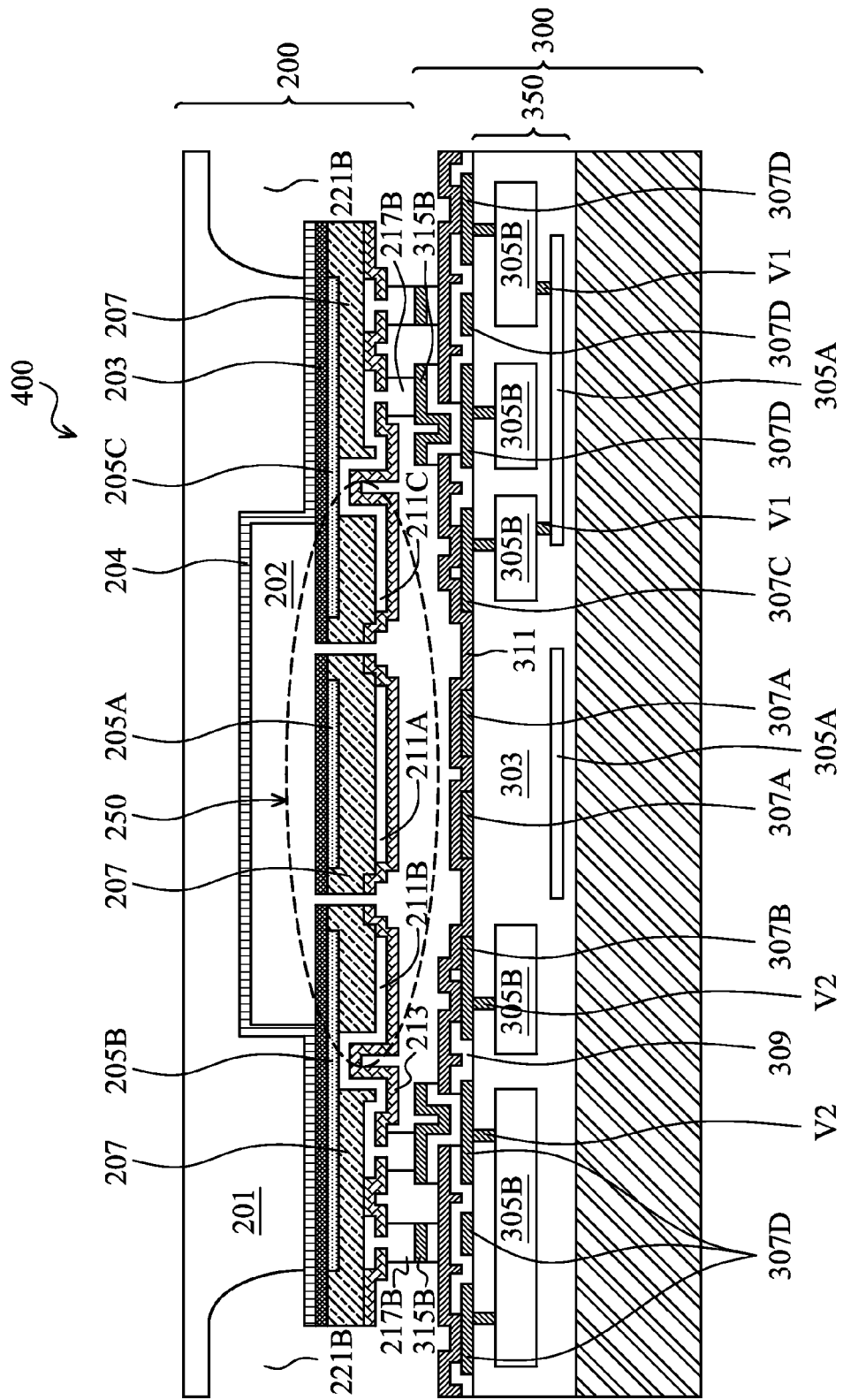
FIGS. 4A to 4B are cross-sectional views of a stacked semiconductor device including a MEMS device and a CMOS device at various stages of manufacture according to at least one embodiment of this disclosure.
Figure 4B:
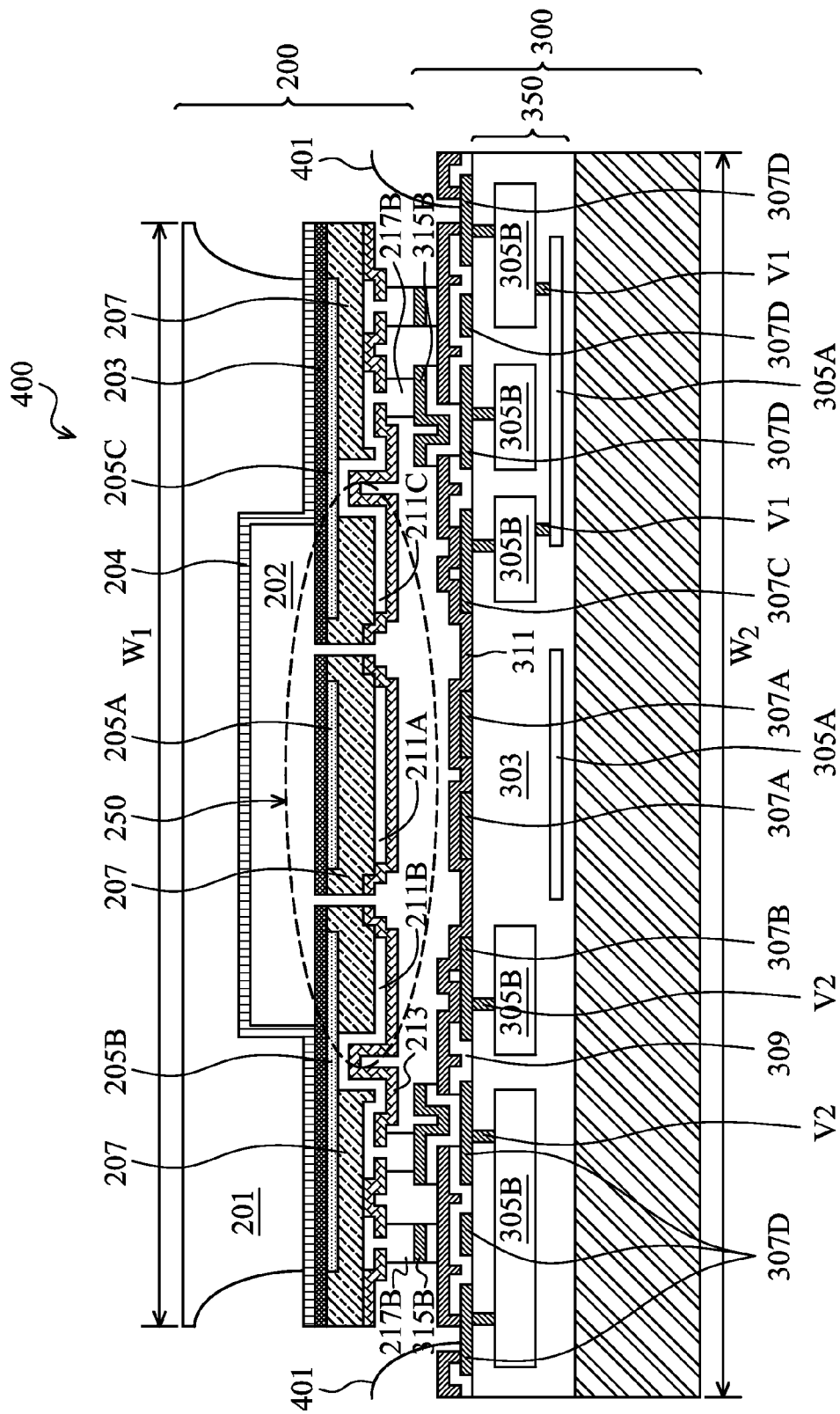

FIGS. 4A to 4B are cross-sectional views of a stacked semiconductor device 400 including the MEMS device 200 and the CMOS device 300 at various stages of manufacture according to one or more embodiments of this disclosure.

Referring back to FIGS. 1A and 1B, the operation 118 in the method 100 is for the MEMS device bonded to the CMOS device to form the stacked semiconductor device. At operation 118, the second bonding features are bonded to the first bonding features over the first substrate.

FIG. 4A is a cross-sectional view of the stacked semiconductor device 400 after performing operation 118. Referring to FIG. 4A, the MEMS device 200 is bonded to the CMOS device 300 to form the stacked semiconductor device 400. In the depicted embodiment, the bonding features 217A-B of the MEMS device 200 are bonded to the bonding features 315A-B of the CMOS device 300, respectively. The bonding features 217A contact the bonding features 315A, and cooperate with the bonding features 315A to electrically connect the MEMS device 200 and the CMOS device 300. The bonding features 217B contact the bonding features 315B, and cooperate with the bonding features 315B to form a closed loop combined seal ring. The closed loop combined seal ring surrounds the movable structure 250 (including the top electrode) of the MEMS device 200, the bottom electrode of the CMOS device 300, and bonding features 217A and 315A. The closed loop combined seal ring is located at the edge of the stacked semiconductor device 400, and protects inner the top electrode and the bottom electrode from moisture or other chemicals in the following processes or in an operation of the stacked semiconductor device 400. The movable structure 250 (including the top electrode) and the bottom electrode are sealed between the MEMS substrate 201 and the CMOS substrate 301. Due to the bonding features 217A-B and the bonding features 315A-B interposed between the MEMS device 200 and the CMOS device 300, the movable structure 250 is suspended over the front side of the CMOS device 300.

In certain examples, a eutectic bonding process is performed to bond the MEMS device 200 and the CMOS device 300. The eutectic bonding process is performed by heating two (or more) materials that are in contact such that the two (or more) materials diffuse together to form an alloy composition. Since the bonding features (217A-B and 315A-B) include a metal material or a semiconductor material, the eutectic bonding process may form a metal/metal bonding (for example, Al/Al bonding) interface or a metal/semiconductor material bonding (for example, Al/Ge bonding) interface.

Referring to FIG. 4B, after bonding processes, the MEMS substrate 201 in the stacked semiconductor device 400 is thinned from a back surface opposite to the movable structure 250 of the MEMS substrate 201. In at least one embodiment, a planarization process, such as a chemical mechanical polishing (CMP) process, grinding, and/or chemical etching, is applied to the back surface of the MEMS substrate 201 to reduce a thickness of the MEMS substrate 201. In some embodiments, a portion of the MEMS substrate 201 above the recesses 221B as shown in FIG. 4A is removed after the thinning of the back surface of the MEMS substrate 201. Hence, a width $W_1$ of the thinned MEMS substrate 201 is less than a width $W_2$ of the CMOS substrate 301 in the stacked semiconductor device 400. A plurality of the metal sections 307D near the edge of the CMOS device 300 extend beyond the edge of the MEMS device 200. The metal sections 307D near the edge of the CMOS device 300 are capable of forming electrical connection structures to an external circuit in the following processes.

After the thinning process, portions of the protection dielectric layer 311 are removed to expose the metal sections 307D near the edge of the CMOS device 300. Electrical connection structures 401 are formed over the metal sections 307D near the edge of the CMOS device 300 to connect to an external circuit. In some examples, the electrical connection structure 401 is a wire made by a wire bonding process as shown in FIG. 4B. In certain examples, the electrical connection structure 401 is a solder bump made by a bumping process. Accordingly, the stacked semiconductor device 500 has been integrated with the MEMS device 200 and the CMOS device 300. Both the CMOS device 300 and the MEMS device 200 may electrically connect to an external circuit through electrical connection structure 401, the metal sections (307A-307D), the MLI 350, the bonding features 315A, the bonding features 217A and the metal units 211B-C.

An operation of the stacked semiconductor device 400 including at least one RF MEMS switch device 200 is described as following. When the movable structure 250 (including the flexible top electrode) is at up-state, the capacitance between the top electrode in MEMS device 200 and the bottom electrode in the CMOS device 300 is "low". A RF signal transmitting in the metal sections 307A (signal element of the bottom electrode) goes all the way alone the metal sections 307A. The RF signal is in "on" state.

When a predetermined voltage is applied between the pull-down elements of the top electrode (metal units 211B-C) and the pull-down elements of the bottom electrode (metal sections 307B-C), the movable structure 250 (including the flexible top electrode) is pulled by an electrostatic force and collapses downward to the bottom electrode in "down" state. The signal element of the top electrode (metal units 211A) is pulled down until it conforms to the protection dielectric layer 311 over the signal element of the bottom electrode (metal sections 307A). The protection dielectric layer 311 and the cap dielectric layer 213 prevent the top electrode and the bottom electrode from electrically being shorted. The capacitance between the top electrode in MEMS device 200 and the bottom electrode in the CMOS device 300 is "high". The RF signal transmitting in the signal element of the bottom electrode (metal sections 307A) may shunt to the signal element of the top electrode (metal units 211A). The RF signal may not go all the way alone the metal sections 307A. The RF signal goes from the metal sections 307A in the bottom electrode to the metal units 211A in the top electrode. The RF signal is in "off" state. The movable top electrode in the MEMS device 200 is variable as a switch to control the transmission of the RF signal.

The combined bumps (the dielectric bumps 309A and the protection dielectric layer 311) may provide a counterforce on the top electrode in the MEMS device 200 to prevent the top electrode sticking on the bottom electrode in the CMOS device 300 if there is a residual electrostatic force between the top and bottom electrodes when the predetermined voltage is withdrawn.

FIGS. 5A to 5E are cross-sectional views of a stacked semiconductor device 500 including the MEMS device 200 and the CMOS device 300 in a variation of manufacture stages of FIGS. 2A-2K, 3A-3E and 4A-4B. Some of the structures in FIGS. 5A to 5E may be substantially similar to the embodiments disclosed in FIGS. 2A-2K, 3A-3E and 4A-4B, and the description of the common structures are not repeated here although fully applicable in the following embodiments as well.

Figure 5A:
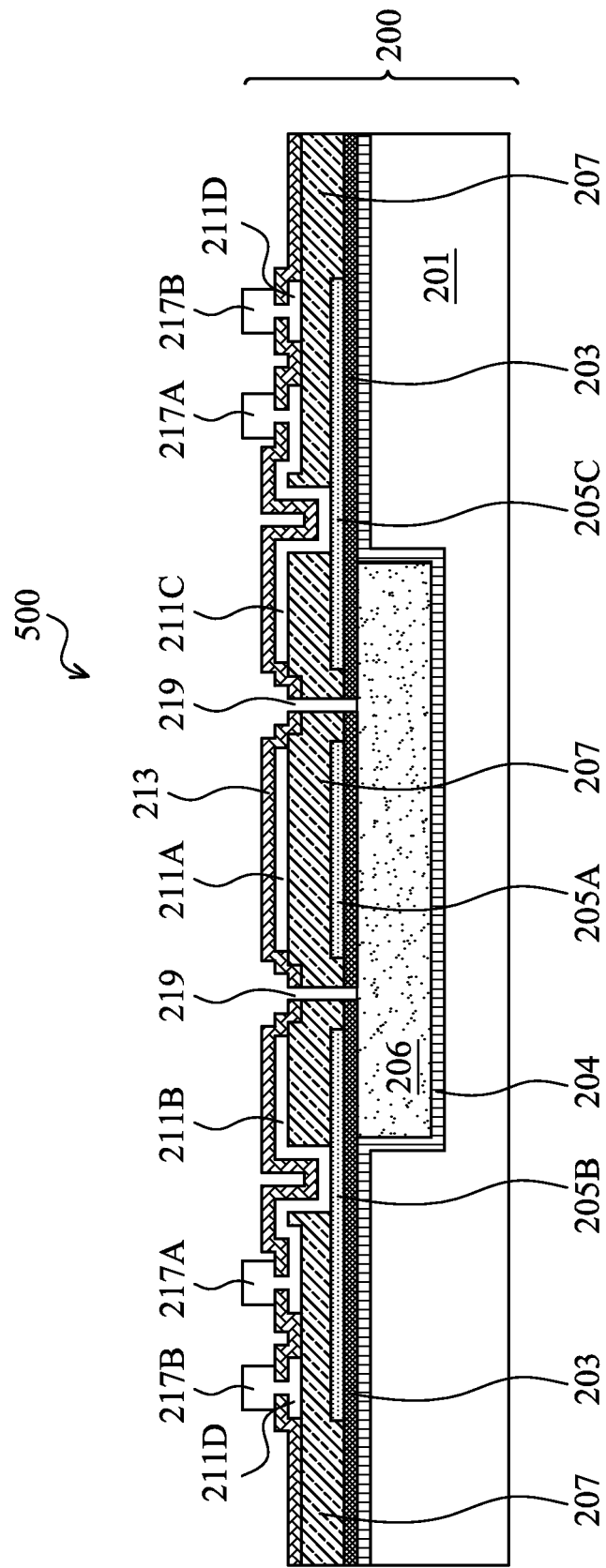
FIGS. 5A to 5E are cross-sectional views of a stacked semiconductor device including a MEMS device and a CMOS device at various stages of manufacture according to some embodiments of this disclosure.

Referring to FIG. 5A, the stacked semiconductor device 500 includes the MEMS device 200 as shown in FIG. 2I. Details of the materials and fabrication methods of the MEMS substrate 201, the cavity 202, the stop layer 204, the sacrificial material 206, the dielectric layer 203, the metal segments 205A-C, the dielectric (membrane) layer 207, the metal units 211A-D, the cap dielectric layer 213, the bonding features 217A-B and the through-holes 219 can be found in the text associated with FIGS. 2A-2I and are not repeated here.

Figure 5B:
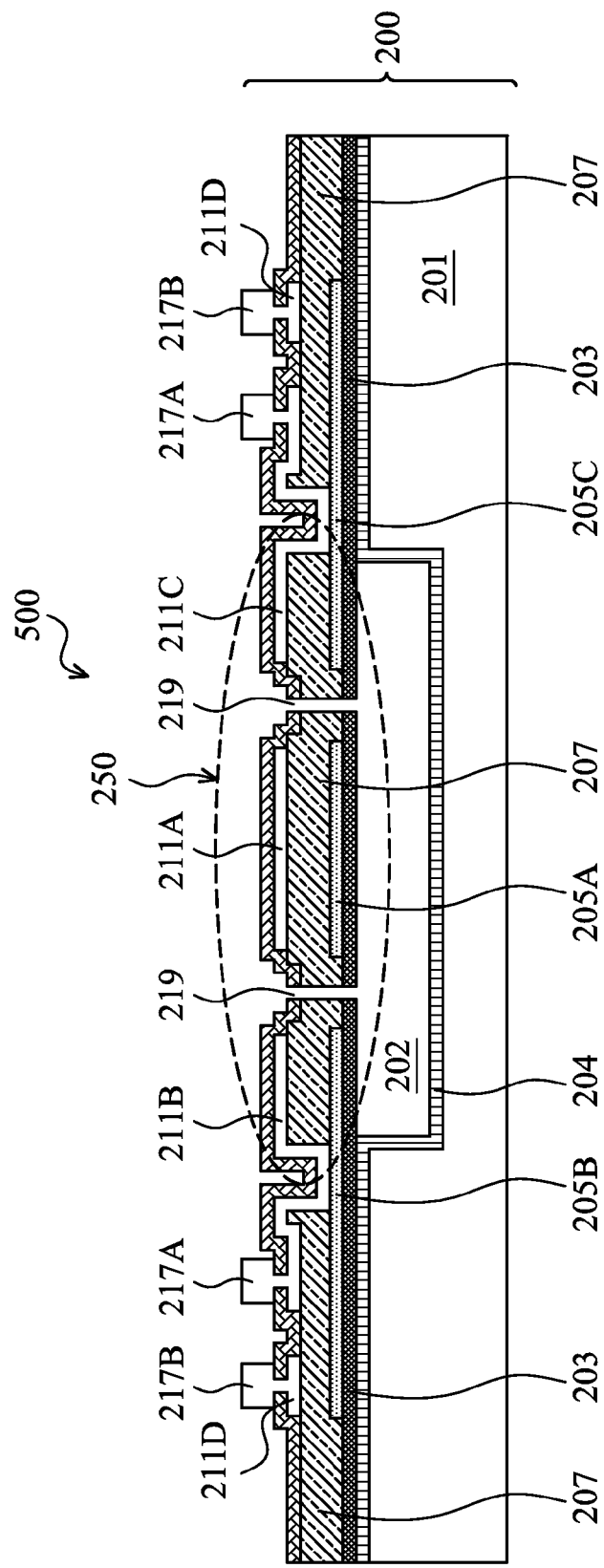

Referring to FIG. 5B, a dry etching process in an ambience including fluorine is performed through the through-holes 219 to etch the sacrificial material 206 in the MEMS substrate 201. The cavity 202 appears under the dielectric membrane 207 in the MEMS substrate 201. The dielectric layer 203, the dielectric membrane 207 and the cap dielectric layer 213 have a higher etching resistance than the sacrificial material 206 in the etching process to make the cavity 202 appear. An etching selectivity of the sacrificial material 206 relative to the dielectric layer 203, the dielectric layer 207 or the cap dielectric layer 213 is larger than 20.

After the formation of the cavity 202, a movable structure 250 is released from the MEMS substrate 201 (or the sacrificial material 206) and suspends over the cavity 202. The movable structure 250 may be substantially similar to the embodiments disclosed in FIG. 2K and the description of the movable structure 250 can be found in the text associated with FIG. 2K and are not repeated here.

The dielectric layer 207 provides mechanical strength and rigidity to act as a suspended membrane or beam for the movable structure 250 in the MEMS device 200. In some examples, a ratio of the thickness of the dielectric membrane 207 to the thickness of the metal units 211A-211C or the metal segments 205A-205C is in a range from about 2 to about 7. In certain examples, a ratio of the thickness of the dielectric membrane 207 to the thickness of the dielectric layer 203 or the cap dielectric layer 213 is in a range from about 5 to about 70.

Figure 5C:
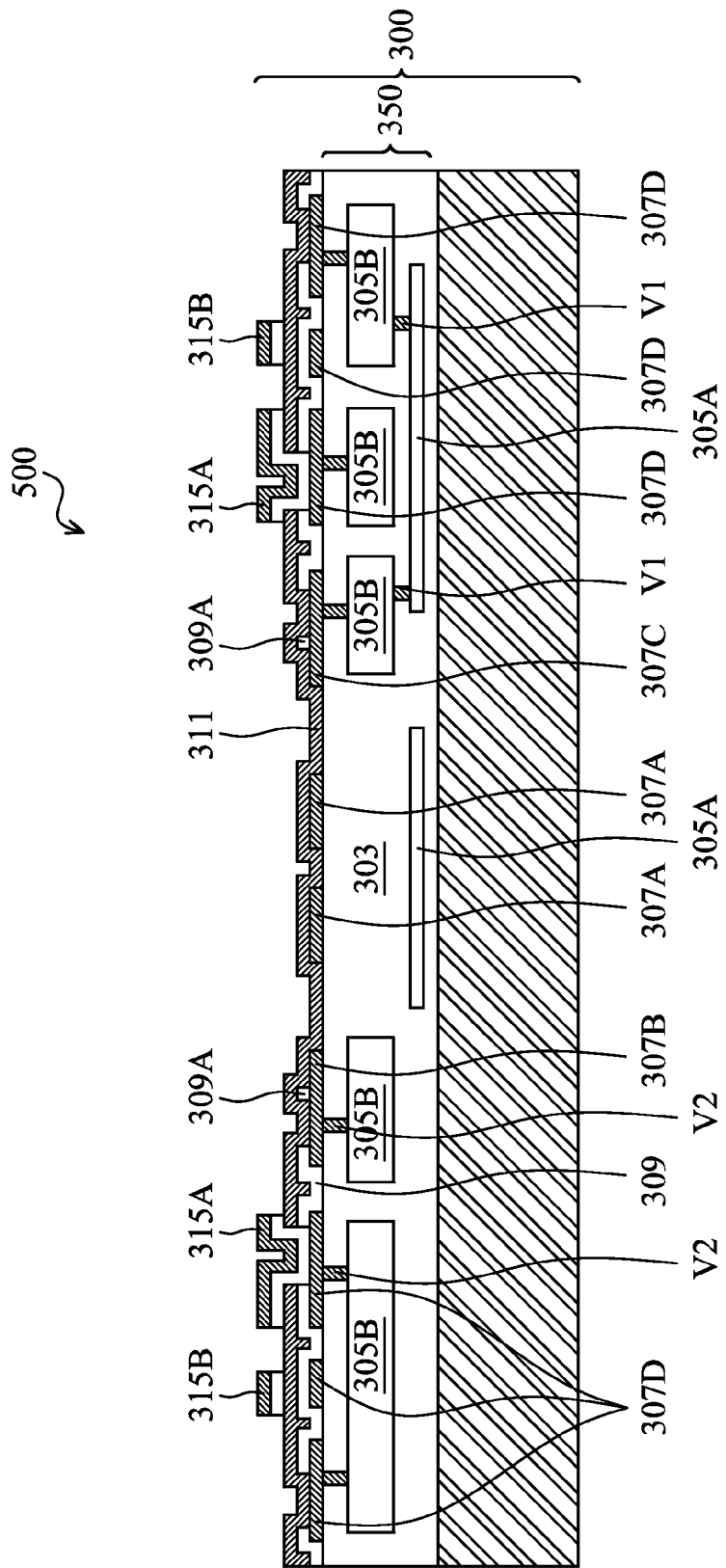

Referring to FIG. 5C, the stacked semiconductor device 500 includes the CMOS device 300 as shown in FIG. 3E. Details of the materials and fabrication methods of the CMOS substrate 301, the ILD layer 303, the MLI 350, the lines 305A-B, the vias V1-V2, the metal sections 307A-D, the dielectric layer 309, the dielectric bumps 309A, the protection dielectric layer 311 and the bonding features 315A-B can be found in the text associated with FIGS. 3A-3E and are not repeated here.

Figure 5D:
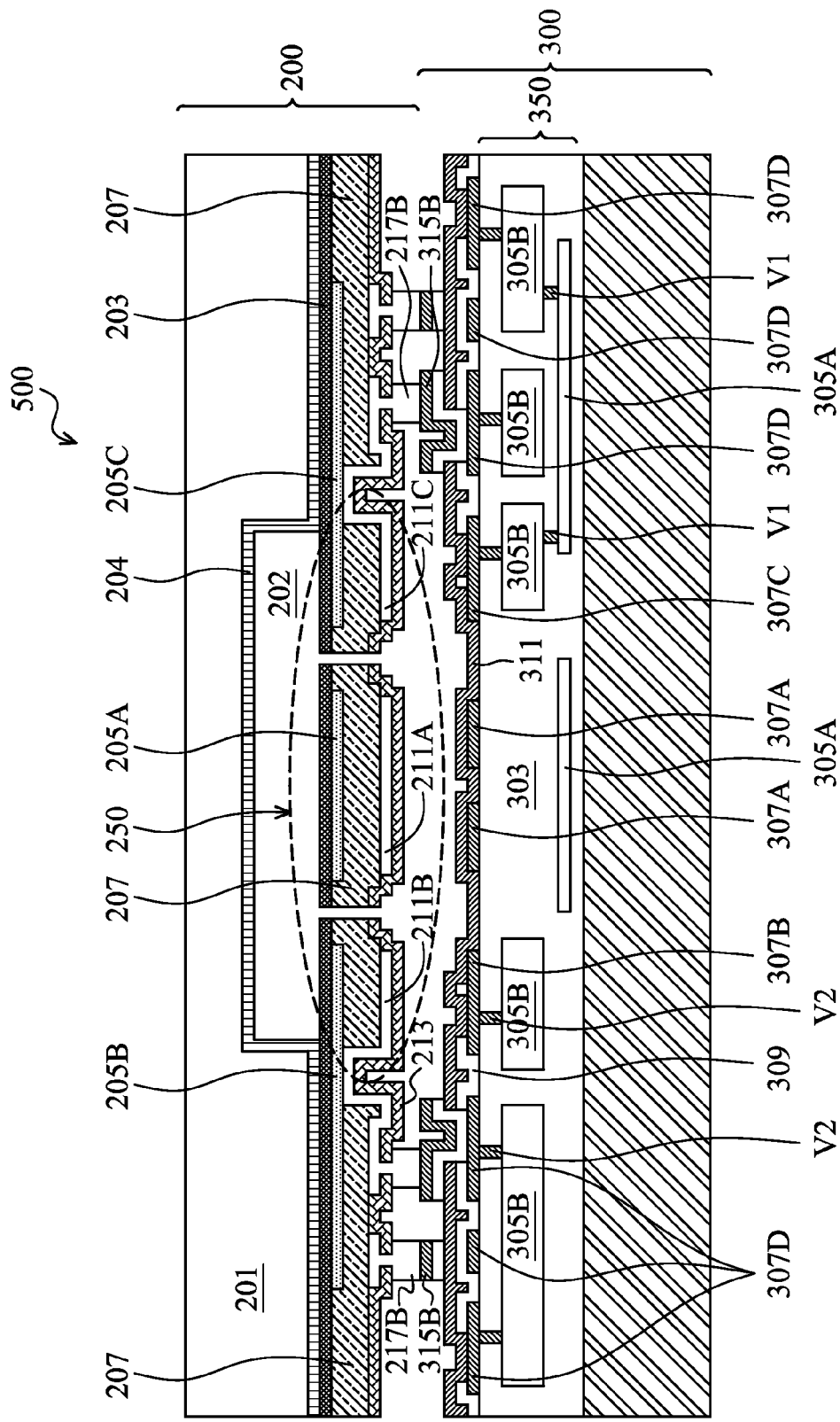

Referring to FIG. 5D, the MEMS device 200 is bonded to the CMOS device 300 to form the stacked semiconductor device 500. In the depicted embodiment, the bonding features 217A-B of the MEMS device 200 are bonded to the bonding features 315A-B of the CMOS device 300, respectively. The bonding features 217A contact the bonding features 315A, and cooperate with the bonding features 315A to electrically connect the MEMS device 200 and the CMOS device 300. The bonding features 217B contact the bonding features 315B, and cooperate with the bonding features 315B to form a closed loop combined seal ring. The closed loop combined seal ring surrounds the movable structure 250 (including the top electrode) and the bottom electrode of the MEMS device 200 and the CMOS device 300. The closed loop combined seal ring is located at the edge of the stacked semiconductor device 500, and protects inner the top electrode and the bottom electrode from moisture or other chemicals in the following processes or in an operation of the stacked semiconductor device 500. The movable structure 250 (including the top electrode) and the bottom electrode are sealed between the MEMS substrate 201 and the CMOS substrate 301. Due to the bonding features 217A-B and the bonding features 315A-B interposed between the MEMS device 200 and the CMOS device 300, the movable structure 250 is suspended over the front side of the CMOS device 300.

Figure 5E:
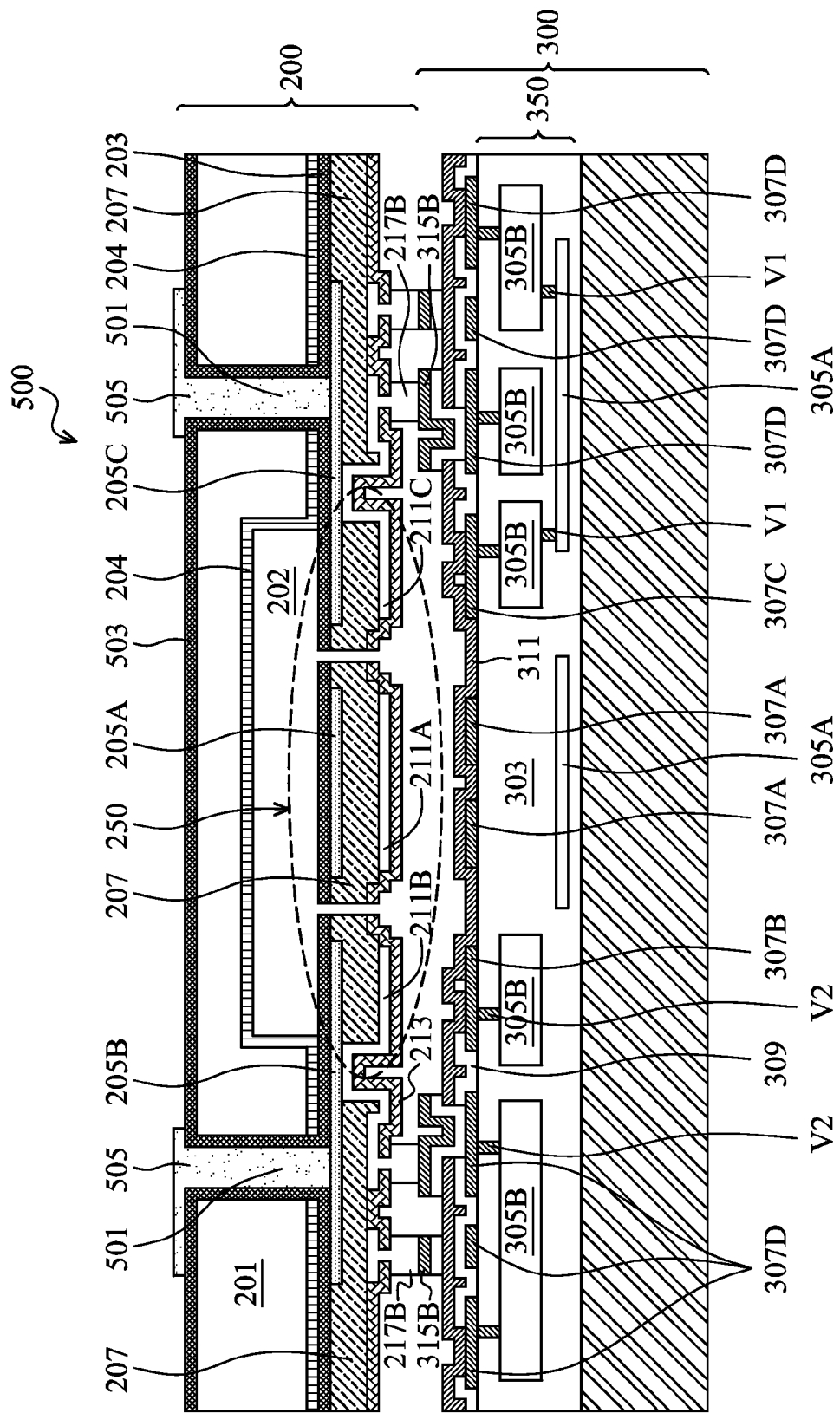

Referring to FIG. 5E, after bonding processes, through substrate vias (TSVs) 505 are formed within substrate 201, extending from the back surface opposite to the movable structure 250 of the MEMS substrate 201 to portions of metal segments 205B and 205C, respectively. As such, TSVs 505 provide both internal and external electrical connections for the stacked semiconductor device 500. The TSVs 505 include an insulation layer 501 formed along sidewalls of TSVs 505 and over the back surface of substrate 201. The TSV 505 may also include a metal trace over the insulation layer 501 over the back surface of substrate 201. The metal trace may bond to a solder ball or a conductive bump to provide the external electrical connection to the metal segments 205B-C and the metal units 211B-C of the MEMS device 200. Furthermore, the metal trace may provide the external electrical connection to CMOS device 300 through the TSV 505, the metal segments 205B-C, the metal units 211B-C, the bonding features 217A, the bonding features 315A, the metal sections (307A-307D) and the MLI 350. Accordingly, the stacked semiconductor device 500 has been integrated with the MEMS device 200 and the CMOS device 300, thereby providing a device to minimize and stabilize undesirable electrical parasitics at a low assembly cost.

In some examples, through substrate holes are formed in the MEMS substrate 201 using lithography patterning processes and etching processes to expose portions of metal segments 205B and 205C. The insulation layer 501 is formed on sidewalls of the through substrate holes and over the back surface MEMS substrate 201. The insulation layer 501 includes silicon oxide, silicon nitride or silicon oxy-nitride. The through substrate holes are overfilled with a conductive material and the excess conductive material is removed, and then the conductive material is patterned to form TSVs 505 depending on design requirements of the MEMS device 200. The conductive material of the TSVs 505 includes aluminum, copper or aluminum/copper alloy. The formation methods of the conductive material include electroless plating, sputtering, printing, electro plating or CVD. In at least one embodiment, a planarization process, such as a chemical mechanical polishing (CMP) process grinding, and/or chemical etching, is applied to the back surface of the MEMS substrate 201 to reduce a thickness of the MEMS substrate 201 before the through substrate holes are formed.

One aspect of the disclosure describes a method of forming a stacked semiconductor device. A first substrate having a front surface is provided. A portion of the first substrate is etched from the front surface to form a cavity. The cavity is filled with a sacrificial material. A flexible dielectric membrane is formed over the sacrificial material and the front surface of the first substrate. Metal units are formed over the flexible dielectric membrane. A cap dielectric layer is formed over the metal units and the flexible dielectric membrane. Portions of the cap dielectric layer are etched to expose the metal units. First bonding features are formed over the cap dielectric layer and contacting the metal units. Portions of the cap dielectric layer and the flexible dielectric membrane are etched to form through-holes to expose portions of the sacrificial material. The sacrificial material is removed through the through-holes from the cavity, thereby forming a movable structure. The movable structure includes the flexible dielectric membrane, the metal units and the cap dielectric layer suspending over the cavity. A second substrate having at least one transistor over the second substrate is provided. A multilayer interconnect is formed over the at least one transistor and electrically coupled to the at least one transistor. Metal sections are formed over the multilayer interconnect. Second bonding features are formed over portions of the metal sections. Second bonding features are bonded to the first bonding features.

A further aspect of the disclosure describes a method of forming a stacked semiconductor device. A first substrate having a front surface is provided. A portion of the first substrate is etched from the front surface to form a cavity. The cavity is filled with a sacrificial material. A flexible dielectric membrane is formed over the sacrificial material and the front surface of the first substrate. A top electrode is formed over the flexible dielectric membrane. A cap dielectric layer is formed over the top electrode and the flexible dielectric membrane. Portions of the cap dielectric layer are etched to expose the top electrode. First bonding features are formed over the cap dielectric layer and contacting the top electrode. Portions of the cap dielectric layer and the flexible dielectric membrane are etched to form through-holes to expose portions of the sacrificial material. The sacrificial material is removed through the through-holes from the cavity, thereby forming a movable structure. The movable structure includes the flexible dielectric membrane, the top electrode and the cap dielectric layer suspending over the cavity. A multilayer interconnect is formed over a second substrate. A bottom electrode is formed over the multilayer interconnect. Second bonding features are formed over the bottom electrode. Second bonding features are bonded to the first bonding features. The top electrode and the bottom electrode construct a capacitor having a variable capacitance.

The present disclosure also describes a stacked semiconductor device. A first substrate has at least one transistor disposed over the first substrate. A multilayer interconnect is disposed over the at least one transistor and is electrically coupled to the at least one transistor. Metal sections are disposed over the multilayer interconnect. First bonding features are over the metal sections. A second substrate has a front surface. A cavity extends from the front surface into a depth D in the second substrate. The cavity has an interior surface. A stop layer is disposed over the interior surface of the cavity. A movable structure is disposed over the front surface of the second substrate and suspending over the cavity. The movable structure includes a dielectric membrane over the front surface and suspending over the cavity, metal units over the dielectric membrane and a cap dielectric layer over the metal units. Second bonding features are over the cap dielectric layer and bonded to the first bonding features. The second bonding features extend through the cap dielectric layer and electrically coupled to the metal units.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming a stacked semiconductor device, the method comprising:
   providing a first substrate having a front surface;
   etching a portion of the first substrate from the front surface to form a cavity;
   filling the cavity with a sacrificial material;
   forming a flexible dielectric membrane over the sacrificial material and the front surface of the first substrate;
   forming metal units over the flexible dielectric membrane;
   forming a cap dielectric layer over the metal units and the flexible dielectric membrane;
   etching portions of the cap dielectric layer to expose the metal units;
   forming first bonding features over the cap dielectric layer and contacting the metal units;
   etching portions of the cap dielectric layer and the flexible dielectric membrane, thereby forming through-holes to expose portions of the sacrificial material;
   removing the sacrificial material through the through-holes from the cavity, thereby forming a movable structure including the flexible dielectric membrane, the metal units and the cap dielectric layer suspending over the cavity;
   providing a second substrate having at least one transistor disposed over the second substrate;
   forming a multilayer interconnect over the at least one transistor and electrically coupled to the at least one transistor;
   forming metal sections over the multilayer interconnect;
   forming second bonding features over portions of the metal sections; and
   bonding the second bonding features to the first bonding features.

2. The method of claim 1, wherein portions of the metal units of the movable structure and portions of the metal sections construct a micro-machined capacitor with a variable capacitance.

3. The method of claim 1, further comprising forming a stop layer on an interior surface of the cavity and the front surface of the first substrate before filling the cavity with the sacrificial material.

4. The method of claim 1, wherein an etching selectivity of the sacrificial material to the flexible dielectric membrane is larger than 20.

5. The method of claim 1, wherein the sacrificial material comprises polycrystalline silicon or amorphous silicon.

6. The method of claim 1, further comprising:
   forming through substrate vias (TSVs) extending from a back surface opposite to the front surface through the first substrate to electrically connect the metal units.

7. The method of claim 1, further comprising:
   reducing a thickness of the first substrate, the first substrate having a width $W_1$ less than a width $W_2$ of the second substrate after reducing the thickness of the first substrate.

8. The method of claim 1, further comprising:
   forming metal segments over the front surface of the first substrate before forming the flexible dielectric membrane.

9. The method of claim 8, further comprising:
   forming a dielectric layer between the metal segments and the front surface of the first substrate.

10. The method of claim 1, wherein a ratio of a thickness of the dielectric membrane to a thickness of the metal units is in a range from about 2 to about 7.

11. The method of claim 1, further comprising:
    forming recesses at outside of the first bonding features, the recesses extending through the cap dielectric layer, the flexible dielectric membrane and portions of the first substrate.

12. The method of claim 1 further comprising forming dielectric bumps over portions of the metal sections.

13. The method of claim 1, wherein a portion of the bonded first bonding features and second bonding features construct a seal ring, the seal ring surrounding the movable structure.

14. A method of forming a stacked semiconductor device, the method comprising:
    providing a first substrate having a front surface;
    etching a portion of the first substrate from the front surface to form a cavity;
    filling the cavity with a sacrificial material;
    forming a flexible dielectric membrane over the sacrificial material and the front surface of the first substrate;
    forming a top electrode over the flexible dielectric membrane;

forming a cap dielectric layer over the top electrode and the flexible dielectric membrane;

etching portions of the cap dielectric layer to expose the top electrode;

forming first bonding features over the cap dielectric layer and contacting the top electrode;

etching portions of the cap dielectric layer and the flexible dielectric membrane, thereby forming through-holes to expose portions of the sacrificial material;

removing the sacrificial material through the through-holes from the cavity, thereby forming a movable structure including the flexible dielectric membrane, the top electrode and the cap dielectric layer suspending over the cavity;

forming a multilayer interconnect over a second substrate;

forming a bottom electrode over the multilayer interconnect;

forming second bonding features over the bottom electrode; and bonding the second bonding features to the first bonding features, wherein the top electrode and the bottom electrode construct a capacitor having a variable capacitance.

15. The method of claim 14, further comprising:

forming a stop layer on an interior surface of the cavity and the front surface of the first substrate before filling the cavity with the sacrificial material.

16. The method of claim 15, wherein an etching selectivity of the sacrificial material to the stop layer is larger than 20.

17. The method of claim 14, wherein an etching selectivity of the sacrificial material to the flexible dielectric membrane is larger than 20.

18. The method of claim 14, further comprising:

forming a dielectric layer and metal segments over the filled sacrificial material and the front surface of the first substrate before forming the flexible dielectric membrane.

19. The method of claim 14, wherein the top electrode includes at least one signal element and at least one pull-down element adjacent to the at least one signal element, the at least one signal element and the at least one pull-down element separated by a gap.

20. A method comprising:

forming a multilayer interconnect over a substrate;

forming metal sections over and electrically connected to the multilayer interconnect;

forming first bonding features over the metal sections;

etching into a front surface of a second substrate a cavity extending from the front surface to a depth D in the second substrate, the cavity having an interior surface;

lining the interior surface with a stop layer;

suspending over the cavity a movable structure, the movable structure including a dielectric membrane, metal units over the dielectric membrane and a cap dielectric layer over the metal units; and forming second bonding features over the cap dielectric layer; and bonding the first bonding features to the second bonding features, wherein the second bonding features extend through the cap dielectric layer and electrically coupled to the metal units.

* * * * *